United States Patent

Feizi-Khankandi et al.

(10) Patent No.: US 9,294,113 B2
(45) Date of Patent: Mar. 22, 2016

(54) ENERGY-EFFICIENT TIME-STAMPLESS ADAPTIVE NONUNIFORM SAMPLING

(75) Inventors: Soheil Feizi-Khankandi, Cambridge, MA (US); Vivek K. Goyal, Cambridge, MA (US); Muriel Médard, Belmont, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 828 days.

(21) Appl. No.: 13/542,070

(22) Filed: Jul. 5, 2012

(65) Prior Publication Data

US 2014/0184273 A1 Jul. 3, 2014

Related U.S. Application Data

(60) Provisional application No. 61/504,440, filed on Jul. 5, 2011.

(51) Int. Cl.
*H03M 1/12* (2006.01)

(52) U.S. Cl.
CPC .................................. *H03M 1/1265* (2013.01)

(58) Field of Classification Search
CPC .............................. H03M 1/1265; H03M 1/12
USPC ............................................. 702/189; 327/91
See application file for complete search history.

(56) References Cited

U.S. PATENT DOCUMENTS

| 4,969,192 | A | * | 11/1990 | Chen et al. ..................... 704/222 |
| 5,577,056 | A |   | 11/1996 | Malik et al. |
| 5,832,046 | A | * | 11/1998 | Li ......................... H04L 7/0054 375/326 |
| 6,075,475 | A | * | 6/2000  | Ellis et al. ..................... 341/144 |
| 6,128,773 | A |   | 10/2000 | Snider |
| 6,487,672 | B1| * | 11/2002 | Byrne .............. G11B 21/10009 360/51 |

(Continued)

FOREIGN PATENT DOCUMENTS

| EP | 1 638 239 A1 | 3/2006 |
| WO | WO 2007/109216 A1 | 9/2007 |

(Continued)

OTHER PUBLICATIONS

Suh, et al., "Send-On-Delta Sensor Data Transmission With a linear Predictor", Sensors 2007.*

(Continued)

*Primary Examiner* — Mohamed Charioui
*Assistant Examiner* — Ruihua Zhang
(74) *Attorney, Agent, or Firm* — Daly, Crowley, Mofford & Durkee, LLP

(57) ABSTRACT

Described herein is a sampling system and related sampling scheme. The system and sampling scheme is based upon a framework for adaptive non-uniform sampling schemes. In the system and schemes described herein, time intervals between samples can be computed by using a function of previously taken samples. Therefore, keeping sampling times (time-stamps), except initialization times, is not necessary. One aim of this sampling framework is to provide a balance between reconstruction distortion and average sampling rate. The function by which sampling time intervals can be computed is called the sampling function. The sampling scheme described herein can be applied appropriately on different signal models such as deterministic or stochastic, and continuous or discrete signals. For each different signal model, sampling functions can be derived.

22 Claims, 7 Drawing Sheets

(56) References Cited

U.S. PATENT DOCUMENTS

| | | |
|---|---|---|
| 6,621,851 B1 | 9/2003 | Agee et al. |
| 6,885,653 B2 | 4/2005 | Choi et al. |
| 7,064,489 B2 | 6/2006 | Price |
| 7,071,853 B2 | 7/2006 | Price |
| 7,095,343 B2 | 8/2006 | Xie et al. |
| 7,164,691 B2 | 1/2007 | Knapp et al. |
| 7,283,564 B2 | 10/2007 | Knapp et al. |
| 7,349,440 B1 | 3/2008 | Chou et al. |
| 7,408,938 B1 | 8/2008 | Chou et al. |
| 7,414,978 B2 | 8/2008 | Lun et al. |
| 7,529,198 B2 | 5/2009 | Jain et al. |
| 7,656,945 B1 * | 2/2010 | Warner .......... H04L 25/03038 375/233 |
| 7,706,365 B2 | 4/2010 | Effros et al. |
| 7,760,728 B2 | 7/2010 | Chou et al. |
| 7,821,980 B2 | 10/2010 | Chakrabarti et al. |
| 7,876,677 B2 | 1/2011 | Cheshire |
| 7,912,003 B2 | 3/2011 | Radunovic et al. |
| 7,945,842 B2 | 5/2011 | He |
| 8,040,836 B2 | 10/2011 | Wu et al. |
| 8,068,426 B2 | 11/2011 | Sundararajan et al. |
| 8,130,776 B1 | 3/2012 | Sundararajan et al. |
| 8,279,781 B2 | 10/2012 | Lucani et al. |
| 8,451,756 B2 | 5/2013 | Lucani et al. |
| 8,482,441 B2 | 7/2013 | Medard et al. |
| 8,504,504 B2 | 8/2013 | Liu |
| 8,571,214 B2 | 10/2013 | Lima et al. |
| 2003/0055614 A1 | 3/2003 | Pelikan |
| 2003/0214951 A1 | 11/2003 | Joshi et al. |
| 2004/0203752 A1 | 10/2004 | Wojaczynski et al. |
| 2005/0010675 A1 | 1/2005 | Jaggi et al. |
| 2005/0078653 A1 | 4/2005 | Agashe et al. |
| 2005/0152391 A1 | 7/2005 | Effros et al. |
| 2005/0251721 A1 | 11/2005 | Ramesh et al. |
| 2006/0020560 A1 | 1/2006 | Rodriguez et al. |
| 2006/0146791 A1 | 7/2006 | Deb et al. |
| 2006/0224760 A1 | 10/2006 | Yu et al. |
| 2007/0046686 A1 | 3/2007 | Keller |
| 2007/0116027 A1 | 5/2007 | Ciavaglia et al. |
| 2007/0274324 A1 | 11/2007 | Wu et al. |
| 2008/0043676 A1 | 2/2008 | Mousseau et al. |
| 2008/0049746 A1 | 2/2008 | Morrill et al. |
| 2008/0123579 A1 | 5/2008 | Kozat et al. |
| 2008/0250875 A1 * | 10/2008 | Khosla et al. .................. 73/863 |
| 2008/0259796 A1 | 10/2008 | Abousleman et al. |
| 2008/0291834 A1 | 11/2008 | Chou et al. |
| 2008/0320363 A1 | 12/2008 | He |
| 2009/0003216 A1 | 1/2009 | Radunovic et al. |
| 2009/0135717 A1 | 5/2009 | Kamal et al. |
| 2009/0153576 A1 | 6/2009 | Keller |
| 2009/0175320 A1 | 7/2009 | Haustein et al. |
| 2009/0195906 A1 * | 8/2009 | Feller ............................. 360/65 |
| 2009/0198829 A1 | 8/2009 | Sengupta et al. |
| 2009/0207930 A1 | 8/2009 | Sirkeci et al. |
| 2009/0238097 A1 | 9/2009 | Le Bars et al. |
| 2009/0248898 A1 | 10/2009 | Gkantsidis et al. |
| 2009/0285148 A1 | 11/2009 | Luo et al. |
| 2009/0310582 A1 | 12/2009 | Beser |
| 2009/0313459 A1 | 12/2009 | Horvath |
| 2009/0316763 A1 | 12/2009 | Erkip et al. |
| 2010/0014669 A1 | 1/2010 | Jiang |
| 2010/0046371 A1 | 2/2010 | Sundararajan et al. |
| 2010/0111165 A1 | 5/2010 | Kim et al. |
| 2010/0146357 A1 | 6/2010 | Larsson |
| 2011/0238855 A1 | 9/2011 | Korsunsky et al. |
| 2012/0057636 A1 | 3/2012 | Tian et al. |
| 2012/0218891 A1 | 8/2012 | Sundararajan et al. |
| 2012/0300692 A1 | 11/2012 | Sfar et al. |
| 2013/0107764 A1 | 5/2013 | Zeger et al. |
| 2013/0114481 A1 | 5/2013 | Kim et al. |
| 2013/0114611 A1 | 5/2013 | Zeger et al. |
| 2013/0195106 A1 | 8/2013 | Calmon et al. |
| 2014/0064296 A1 | 3/2014 | Haeupler et al. |
| 2014/0185803 A1 | 7/2014 | Lima et al. |
| 2014/0268398 A1 | 9/2014 | Medard et al. |
| 2014/0269485 A1 | 9/2014 | Medard et al. |
| 2014/0269503 A1 | 9/2014 | Medard et al. |
| 2014/0269505 A1 | 9/2014 | Medard et al. |
| 2014/0280395 A1 | 9/2014 | Medard et al. |
| 2014/0280454 A1 | 9/2014 | Medard et al. |

FOREIGN PATENT DOCUMENTS

| | | |
|---|---|---|
| WO | WO 2010/005181 A2 A3 | 1/2010 |
| WO | WO 2010/025362 A2 | 3/2010 |
| WO | WO 2010/025362 A2 A3 | 3/2010 |
| WO | WO 2011/043754 A1 | 4/2011 |
| WO | WO 2011/119909 A1 | 9/2011 |
| WO | WO 2012/167034 A2 | 12/2012 |
| WO | WO 2013/006697 A2 | 1/2013 |
| WO | WO 2013/067488 A1 | 5/2013 |
| WO | WO 2013/116456 A1 | 8/2013 |
| WO | WO 2014/159570 A1 | 10/2014 |
| WO | WO 2014/160194 A3 | 10/2014 |

OTHER PUBLICATIONS

Laine, "Generalized linear prediction based on analysis signals", IEEE, 1995.*

Feizi, et al.; "Locally Adaptive Sampling;" Communication, Control, and Computing; 2010; 48$^{th}$ Annual Allerton Conference, IEEE; Sep. 29, 2010; pp. 152-159.

Soo Suh; "Send-On-Delta Sensor Data Transmission With A Linear Predictor;" Sensors; ISSN 1424-8820; vol. 7; No. 4; Apr. 26, 2007; pp. 537-547.

Search Report of the ISA for PCT/US2012/045548 dated Dec. 14, 2012.

Written Opinion of the ISA for PCT/US2012/045548 dated Dec. 14, 2012.

International Preliminary Report on Patentability of the ISA for PCT/US2012/045548 dated Jan. 16, 2014.

Castro, et al.; "Upper and Lower Error Bounds for Active Learning;" The 44'th Annual Allerton Conference on Communication, Control and Computing; vol. 2, No. 2.1; 2006, 10 pages.

Donoho, et al.; "Estimating Covariances of Locally Stationary Processes: Rates of Convergence of Best Basis Methods;" Statistics, Stanford University, Stanford, California, USA, Tech. Rep; 1998; pp. 1-64.

Lai; "Sequential Analysis: Some Classical Problems and New Challenges"; Statistica Sinica, vol. 11, No. 2; 2001; pp. 303-350.

Landau; "Application of the Volterra Series to the Analysis and Design of an Angle Track Loop;" IEEE Transactions on Aerospace and Electronic Systems; vol. AES-8, No. 3; May 1972; pp. 306-318.

Nobel; "Hypothesis Testing for Families of Ergodic Processes;" Bernoulli-London, vol. 12, No. 2; 2006; 21 pages.

Mallat, et al.; "Adaptive Covariance Estimation of Locally Stationary Processes;" Annals of Statistics, vol. 26, No. 1; 1998; pp. 1-43.

Ryabko, et al.; "On Hypotheses Testing for Ergodic Processes;" Information Theory Workshop; ITW'08; IEEE; 2008; pp. 281-283.

Shields; "The Interactions Between Ergodic Theory and Information Theory;" IEEE Transactions on Information Theory, vol. 44, No. 6; Oct. 1998; pp. 2079-2093.

U.S. Appl. No. 13/654,953, filed Oct. 18, 2012, Zeger et al.
U.S. Appl. No. 13/655,034, filed Oct. 18, 2012, Medard et al.
U.S. Appl. No. 13/890,604, filed May 9, 2013, Zeger et al.
U.S. Appl. No. 14/208,683, filed Mar. 13, 2014, Calmon et al.

"Data Service Options for Spread Spectrum Systems: Radio Link Protocol Type 3;" 3GPP2 C.S0017-010-A; Version 2.1; Sep. 2005.

"Guest Editorial Wireless Video Transmission;" IEEE Journal on Selected Areas in Communications; vol. 28; No. 3; Apr. 2010; pp. 297-298.

Abichar, et al.; "WiMax vs. LTE: Who Will Lead the Broadband Mobile Internet?;" Mobile Computing; IEE Computer Society; IT Pro May/Jun. 2010; pp. 26-32.

AbuZeid, et al.; "IR-HARQ vs. Joint Channel-Network Coding for Cooperative Wireless Communication;" Cyber Journals: Multidisciplinary Journals in Science and Technology, Journal of Selected Areas in Telecommunications (JSAT); Aug. 2011; pp. 39-43.

(56) References Cited

OTHER PUBLICATIONS

Acedanski, et al.; "How Good is Random Linear Coding Based Distributed Network Storage?;" Proc. 1st Workshop on Network Coding, Theory, and Applications (Netcod'05); Apr. 2005, 6 pages.
Adamson, et al.; "Multicast Negative-Acknowledgement (NACK) Building Blocks;" Internet Engineering Task Force (IETF), RFC; vol. 5401, Nov. 2008; 42 pages.
Adamson, et al.; "NACK-Oriented Reliable (NORM) Transport Protocol;" Internet Engineering Task Force (IETF); RFC; vol. 5740; Nov. 2009; 94 pages.
Adamson, et al.; "Quantitative Prediction of NACK-Oriented Reliable Multicast (NORM) Feedback;" Proceedings, MILCOM 2000; vol. 2; Oct. 2002; 6 pages.
Ahlswede, et al.; "Network Information Flow;" IEEE Transactions on Information Theory; vol. 46; No. 4; Jul. 2000; pp. 1204-1216.
Ahmed, et al.; "On the Scaling Law of Network Coding Gains in Wireless Networks;" IEEE; MILCOM 2007; Oct. 2007; 7 pages.
Allman, et al.; "Fast Retransmit / Fast Recovery—TCP Congestion Control;" IETF; Section 3.2; RFC 2581; http://tools.ietf.org/html/rfc2581#section-3.2; Apr. 1999; downloaded on Nov. 2, 2011; 14 pages.
Armstrong, et al.; "Distributed Storage with Communication Costs;" IEEE Forty-Ninth Annual Allerton Conference—Allerton House; Sep. 28-30, 2011; pp. 1358-1365.
Awerbuch, et al.; "On-Line Generalized Steiner Problem;" Proceedings of the 7th Annual ACM-SIAM Symposium on Discrete Algorithms; pp. 1-12; 1996.
Baek, et al.; "The international Journal of Computer and Telecommunications Networking;" vol. 56; issue 6; Apr. 2012; pp. 1745-1752.
Baron, et al.; "Coding Schemes for Multisiot Messages in Multichannel ALOHA With Deadlines;" IEEE Transactions on Wireless Communications; vol. 1; No, 2; Apr. 2002; pp. 292-301.
Bellare, et al.; "A Concrete Security Treatment of Symmetric Encryption: Analysis of the DES Modes of Operation;" Proc. 38th Annual Symposium on Foundations of Computer Science; Oct. 1997; pp. 1-32.
Berman, et al.; "Improved Approximations for the Steiner Tree Problem:" Journal of Algorithms; Chapter 39; pp. 325-334.
Bhadra, et al.; "Looking at Large Network Coding vs. Queuing;" Proc. Of the 25th IEEE International Conference on Computer Communications (INFOCOM); Apr. 2006; 12 pages.
Bharath-Kumar, et al.; "Routing to Multiple Destinations in Computer Networks;" IEEE Transactions on Communications; vol. Com-31; No. 3; Mar. 1983; pp. 343-351.
Bhargava, et al.; "Forward Error Correction Coding:" Mobile Communications Handbook; Part 1: Basic Principals; 1999; 18 pages.
Birk, et al.; "Judicious Use of Redundant Transmissions in Multichannel ALOHA Networks with Deadlines;" IEEE Journal on Selected Areas in Communications; vol. 17; No. 2; Feb. 1999; pp. 257-269.
Bisson, et al.; "Reducing Hybrid Disk Write Latency with Flash-Backed I/O Requests;" Proceedings of the Fifteenth IEEE International Symposium on Modeling, Analysis, and Simulation of Computer and Telecommunications Systems (MASCOTS'07); Oct. 2007; pp. 402-409.
Bonni, et al.; "Automatic Muiti-interface Management Through Frage Handling;" Springer; Mobile Networks and Applications; Feb. 2009; pp. 4-17.
Borokhovich, et al.; "Tight bounds for Algebraic Gossip on Graphs;" Proc. Of the IEEE International Symposium on Information Theory (ISIT); Jun. 13-18, 2010; 14 pages.
Borst, et al.; "Distributed Caching Algorithms for Content Distribution Networks"; IEEE Infocom; 2010 Proceedings IEEE; Mar. 14-19, 2010, 9 pages.
Borst, et al.; "Distributed Caching Algorithms for Content Distribution Networks;" Power Point Presentation; BCAM Seminar; Bilbao, Sep. 30, 2010; 36 pages.

Bui, et al.; "A Markovian Approach to Multipath Data Transfer in Overlay Networks;" IEEE Transactions on Parallel and Distributed Systems; vol. 21; No. 10; Oct. 2010; pp. 1396- 1411.
Cai, et al.; "Secure Network Coding;" IEEE; ISIT; Jun. 30-Jul. 6, 202; p. 323.
Calmon, et al.; "Network Coding Over Multiple Network interfaces Using TCP;" Presentation: Information Theory and Applications Workshop (ITA) 2012; San Diego, CA; Feb. 5, 2012; 55 pages.
Cardinal, et al.; "Minimum Entrophy Combinatorial Optimization Problems;" Data Structure and Algorithms, Discrete Mathematics; Aug. 17, 2010; pp. 1-16.
Celik, et al.; "MAC for Networks with Multipacket Reception Capability and Spatially Distributed Nodes;" Proc. IEEE INFOCOM 2005; Apr. 2008; 9 pages.
Celik; "Distributed MAC Protocol for Networks with Muitipacket Reception Capability and Spatially Distributed Nodes;" Master's Thesis; MIT Department of Electrical Engineering and Computer Science; May 2007; 127 pages.
Cha, et al.; "I Tube, You Tube, Everybody Tubes: Analyzing the World's Largest User Generated Content Video System;" 7th ACM GIGCOMM Conference on Internet Measurement; IMC'07; Oct. 24-26, 2007; 13 pages.
Chakrabaiti, et al.; "Approximation Algorithms for the Unsplittable Flow Problem;" Proceedings of the 5th International Workshop on Approximation Algorithms for Combinatorial Optimization; Sep. 2005, pp. 1-27.
Chakrabarti, et al.; Approximation Algorithms for the Unsplittable Row Problem; Algorithmica (2007); Springer Science—Business Media, Aug. 2005; 16 pages.
Charikar, et al.; "Approximation Algorithms for Directed Steiner Problems;" Proceedings of the 9th ACM-SIAM Symposium on Discrete Algorithms, pp. 1-16; 1998.
Chen, et al.; ,"Pipeline Network Coding for Multicast Streams;" ICMU Org.; 2010; 7 pages.
Chou, et al.; "FEC and Psaudo-ARQ for Receiver-driven Layered Multicast of Audio and Video;" Data Compression Conference (DCC). 2000; Proceedings; Jan. 2000; 10 pages.
Chou, et al.; "Practical Network Coding;" Proceedings of the 41st Annual Allerton Conference on Communication, Control, and Computing; Oct. 2003; 10 pages.
Cisco Visual Networking Index: Forecast and Methodology; 2009-2014; White Paper; Jun. 2, 2010; pp. 1-17.
Cloud, et al.; "Co-Designing Multi-Packet Reception, Network Coding, and MAC Using a Simple Predictive Model;" arXiv:1101.5779v1 [cs.NI]; Submitted to W.Opt 2011;Jan. 30, 2011; pp. 1-8.
Cloud, et al.; "Effects of MAC approaches on non-monotonic saturation with COPE—a simple case study;" Military Communication Conference, 2011—MILCOM; Aug. 11, 2011; 7 pages.
Cloud, et al.; "MAC Centered Cooperation—Synergistic Design of Network Coding, Multi-Packet Reception, and Improved Fairness to Increase Network Throughput" IEEE Journal on Selected Areas in Communications; vol. 30; No. 2; Feb. 2012; pp. 1-8.
Cloud, et al.; "Multi-Path TCP with Network Coding;" Wireless@mit—MIT Center for Wireless Networks and Mobile Computing; 2012 Inaugural Retreat; Oct. 10-11, 2012.
Cloud, et al.; U.S. Appl. No. 13/654,953 filed on Oct. 18, 2012.
Costa, et al.; "informed Network Coding for Minimum Decoding Delay;" Fifth IEEE International Conference on Mobile Ad-hoc and Sensor Systems; Sep. 2008; pp. 80-91.
Coughlin, et al.; Years of Destiny: HDD Capital Spending and Technology Developments from 2012-2016; IEEE Santa Clara Valley Magnetics Society; Jun. 19, 2012; pp. 1-28
Dana, et al.; "Capacity of Wireless Erasure Networks;" IEEE Transactions on Information Theory: vol. 52; No. 3; Mar. 2006; pp. 789-504.
Dana, et al.; "Capacity of Wireless Erasure Networks;" Jan. 2006; 41 pages.
Deb, et al.; "Algebraic Gossip: A Network Coding Approach to Optimal Multiple Rumor Mongering;" Proc. Of the 42nd Allerton Conference on Communication, Control, and Computing; Jan. 2004; 10 pages.

(56) References Cited

OTHER PUBLICATIONS

Deb, et al.; "On Random Network Coding Based Information Dissemination:" Proc. Of the IEEE International Symposium on Information Theory (ISIT); Sep. 4-9, 2005; 5 pages.
Demers, et al.; "Epidemic Algorithms for Replicated Database Maintenance;" PODC '87 Proceedings of the sixth annual ACM Symposium on Principles of distributed computing; Jan. 1987; pp. 1:12.
Dias, et al.; "Performance Analysis of HARQ in WiMax Networks Considering Imperfect Channel Estimation;" The $7^{th}$ International Telecommunications Symposium (ITS 2010); 2010; 5 pages.
Dimakis, et al.; "A Survey on Network Codes for Distributed Storage;" Proceedings of the IEEE; vol. 99; No. 3; Mar. 2011; pp. 476-489.
Dimakis, et al.; "Network Coding for Distributed Storage Systems;" IEEE/ACM Transactions on Information Theory; vol. 56; No, 9; pp. 1-13.
Effros; Distortion-Rate Bounds for Fixed-and Variable-Rate Multiresolution Source Codes; IEEE Transactions on Information Theory; vol. 45, No. 6; Sep. 1999; pp. 1887-1910.
Effros; "Universal Multiresolution Source Codes;" IEEE Transactions on Information Theory; vol. 47; No. 6; Sep. 2001; pp. 2113-2129.
El Bahri, et al.; "Performance Comparison of Type I, II and III Hybrid ARQ Schemes over AWGN Channeis;" 2004 IEEE International Conference on Industrial Technology (ICIT); vol. 3; Dec. 8-10, 2004; pp. 1417-1421.
Eryilmaz, et al.; On Delay Performance Gains From Network Coding: Information Sciences and Systems; 2006 $40^{th}$ Annual Conference on Mar. 22-24, 2006; 7 pages.
Fan, et al.; "Reliable Relay Assisted Wireless Multicast Using Network Coding;" IEEE Journal on Selected Areas in communications; vol. 27; No. 5; Jun. 2009; pp. 749-762.
Feizi, et al.; "On Network Functional Compression;" arXiv online repository; URL: http://arxiv.org/pdf/1011.5496v2.pdf; Nov. 30, 2010p pp. 1-50.
Feizi, et al.; "When Do Only Sources Need to Compute? On Functional Compression in Tree Networks;" $47^{th}$ Annual Allerton Conference, IEEE; Sep. 30, 2009; pp. 447-454.
Feizi, et al.; "Cases Where Finding a Minimum Entropy Coloring of a Characteristic Graph is a Polynomial Time Problem;" IEEE International Symposium on Information Theory; Jun. 13, 2010; pp. 116-120.
Ferner, et al.; "Toward Sustainable Networking: Storage Area Networks with Network Coding:" Fiftieth Annual Allerton Conference; IEEE; Oct. 1-5, 2012; pp. 517-524.
Ford; "Architectural Guidelines for Multipath TCP Development" Internet Engineering Task Force; Internet-Draft; Dec. 8, 2010; 17 pages.
Dies; "TCP Extension for Multipath Operations with Multiple Addresses draft-ford-mptcp-multiaddressed-03;" Internet Engineering Task Force; Internet-Draft; Mar. 8, 2010; 35 pages.
Fragouli, et al.; "Wireless Network Coding: Opportunities & Challenges;" MILCOM; Oct. 2007; 8 pages.
Frossard, et al.; "Media Streaming With Network Diversity;" Invited Paper; Proceedings of the IEEE; vol. 96, No. 1; Jan. 2008; pp. 39-53.
Gaibraith, et al.; (HGST): "Iterative Detection Read Channel Technology in Hard Disk Drives;" Whitepaper; Nov. 2008; 8 pages.
Garcia-Luna-Aceves; "Challenges: Towards Truly Scalabe Ad Hoc Networks:" MobiCom 2007; Sep. 2007: pp. 207-214.
Garcia-Luna-Aceves; "Extending the Capacity of Ad Hoc Networks Beyond Network Coding;" IWCMC 07; Proceedings of the 2007 International Conference on Wireless Communications and Mobile Computing; ACM; 2007; pp. 91-96.
Ghaderi, et al.; Reliability Gain of Network Coding in Lossy Wireless Networks; Infocom 2008; The $27^{th}$ Conference on Computer Communications IEEE: Apr. 13-18, 2008; 5 pages.
Gheorghiu, et al.; "Multipath TCP with Network Coding for Wireless Mesh Networks;" IEEE Communications (ICC) 2010 International Conference; May 23-37, 2010; 5 pages.
Gheorghiu, et al.; "On the Performance of Network Coding in Multi-Resolution Wireless Video Streaming;" IEEE International Symposium on Jun. 9-11, 2010; 6 pages.
Ghez, et al.; "Stability Properties of Slotted Aloha with Multipacket Reception Capability;" IEEE Transactions on Automatic Control; vol. 33; No. 7; Jul. 1988; pp. 640-649.
Gkantsidis, et al.; "Cooperative Security for Network Coding File Distribution," Proc. IEEE Infocom; Apr. 2006; 13 pages.
Gollakota, et al.; "ZigZag Decoding: Combating Hidden Terminals in Wireless Networks:" SIGCOMM 08; Aug. 17-22; pp. 159-170.
Golrezaei, et al.; "FemtoCaching: Wireless Video Content Delivery Through Distributed Caching Helpers;" arXiv:1109.4179v2; Apr. 7, 2012; pp. 1-11.
Grant, et al.; "Graph Implementation for Nonsmooth Convex Programs;" LNCIS 371; Springer-Verlag Limited; Jan. 2008; pp. 95-110.
Gupta; "The Capacity of Wireless Networks;" IEEE Transactions on Information Theory; vol. 46; No. 2; Mar. 2000; pp. 388-404.
Hadzi-Velkov, et al.; "Capture Effect in IEEE 802.11 Basic Service Area Under Influence of Rayleigh Fading and Near/Far Effect;" IEEE; PIMRC 202; vol. 1; Sep. 2002; 5 pages.
Haeupler, et al.; "One Packet Suffices—Highly Efficient Packetized Network Coding With Finite Memory;" IEEE International Symposium on Information Theory (ISIT) Proceedings; Jul. 31, 2011-Aug. 5, 2011; 5 pages.
Haeupler; "Analyzing Network Coding Gossip Made Easy;" Proc. Of the $43^{rd}$ Symposium on Theory of Computing (STOC); Jan. 2011, 13 pages.
Haeupler, et al.: "Optimality of Network Coding in Packet Networks;" ArXiv, Feb. 17, 2011; 5 pages.
Haley, et al.; "Reversible Low-Density Parity-Check Codes;" IEEE Transactions on Information Theory; vol. 55; No. 5; May 2009; pp. 2016-2036.
Halloush, et al.; "Network Coding with Multi-Generation Mixing: Analysis and Applications for video Communication;" IEEE International Conference on Communications; May 19, 2008; pp. 138-202.
Han, et al.; "Multi-Path TCP: A Joint Congestion Control and Routing Scheme to Exploit Path Diversity in the Internet;" IEEE/ACM Transactions on Networking (TON); vol. 14; No. 6, Dec. 2006; 26 pages.
Han et al.; "On Nework Coding for Securty;" IEEE Military Communications Conferece; Oct. 2007; pp. 1-6.
Hassner, et al.; "4K Bye-Sector HDD-Data Format Standard;" Windows Hardware and Driver Centrai: San Jose, CA; Aug. 14, 2013; 5 pages.
Ho, et al.; "A Random Linear Network Coding Approach to Multicast;" IEEE Transactions on Information Theory; vol. 52; No. 10; Oct. 2006; pp. 4413-4430.
Ho, et al.; "Byzantine Modification Detection in Multicast Networks using Randomized Network Coding;" IEEE; ISIT; Jun. 27-Jul. 2, 2004; p. 144.
Ho, et al.; "Network Coding from a Network Flow Perspective;" ISIT; Jun.-Jul. 2003; 6 pages.
Ho, et al.; "On Randomized Network Coding;" Proceedings of $41^{st}$ Annual Allerton Conference on Communications, Control and Computing; Oct. 2003; 10 pages.
Ho, et al.; "On the utility of network coding in dynamic environments;" International Workshop on Wireless AD-HOC Networks (IWWAN); 2004; pp. 1-5.
Ho, et al.; "The Benefits of Coding over Routing in a Randomized Setting;" Proceedings of 2003 IEEE International Symposium on Information Theory; Jun. 2003: pp. 1-6.
Ho, et al.; "The Benefits of Coding over Routing in a Randomized Setting;" IEEE; ISIT Jun. 29-Jul. 4, 2003; p. 442.
Hofri; "Disk Scheduling: FCFS vs. SSTF Revisited;" Communications of the ACM: vol. 23; No. 11; Nov. 1980; pp. 645-653.
Hong, et al.; Network-coding-based hybrid AQR scheme for mobile relay networks; Electronics Letters; vol. 46: No. 7; Apr. 1, 2010; 2 pages.
International Disk Drive Equipment and Materials Assoc.; "Advanced Standard;" in Windows Hardware Engineering Conf.; May 2005; 11 pages.

(56) References Cited

OTHER PUBLICATIONS

Iyer, et al.; "Anticipatory scheduling: A disk scheduling framework to overcome deceptive idleness in synchronous I/O;" SIGOPS Operating Sys. Review; vol. 35; No. 5; Dec. 2001; 14 pages.

Jacobson, et al.; "Disk scheduling algorithms based on rotational position;" Hewlett-Packard laboratories; Palo Alto, CA; Technical Report HPL-CSP-91-7rev1; Feb. 26, 1991; 17 pages.

Jaggi, et al.; "Low Complexity Algebraic Multicast Network Codes;" Proceedings of the IEEE International Symposium on Information Theory; Jul. 4, 2003; 1 page.

Jaggi, et al.; "Resilient Network Coding in the Presence of Byzantine Adversaries;" Proc. IEEE INFOCOM; May 2007; 9 pages.

Jakubczak, et al.; "One-Size-Fits-All Wireless Video;" ACM SigComm Hotnets 2009; 6 pages.

Jamieson, et al.; "PPR: Partial Packet Recovery for Wireless Networks;" SIGCOMM 07; Aug. 27-31, 2007; 12 pages.

Jamieson, et al.; "PPR: Partial Packet Recovery for Wireless Networks;" Presentation; SIGCOMM 07; Aug. 27-31, 2007; 25 pages.

Jannaty, et al.; "Full Two-Dimensional Markov Chain Analysis of Thermal Soft Errors in Subthreshol Nanoscale CMOS Devices;" IEEE Transactions on Device and Materials Reliability: vol. 11; No. 1; Mar. 2011; pp. 50-59.

Ji, et. al.; "A network coding based hybrid ARQ algorithm for wireless video broadcast;" Science China; Information Sciences; vol. 54; No. 6; Jun. 2011; pp. 1327-1332.

Jin, et al.; "Adaptive Random Network Coding in WiMAX;" Communications, 2008; ICC'08 IEEE International Conference on May 19-23, 2008; 5 pages.

Jin, et al.; "Is Random Network Coding Helpful in WiMax;" IEEE $27^{th}$ Conference on Computer Communications; Apr. 2008; 5 pages.

Jolfaei, et al.; "A New Efficient Selective Repeat Protocol for Point-To_Multipoint Communication;" Communications 1993; ICC'93 Genova Technical Program, Conference Record; IEEE International Conference on May 23-26, 1993; Voi. 2; pp. 1113-1117.

Karkpinski, et al.; "New Approximation Algorithms for the Steiner Tree Problems:" Technical Report, Electronic Colloquium on Computational Complexity (ECCC) TR95-030; 1995; pp. 1-17.

Karp, et al.; "Randomized Rumor Spreading;" IEEE Proceeding FOCS '00 Proceedings of the $41^{st}$ Annual Symposium on Foundations of Computer Science; Jan. 2000; pp. 565-574.

Katti, et al.; "XORs in the Air: Practical Wireless Network Coding;" IEEE/ACM Transactions on Networking; vol. 16; No. 3; 2008; pp. 1-14.

Katti, et al.; "XORs in the Air: Practical Wireless Network Coding;" ACM SiGCOMM '06; Computer, Communications Review; vol. 36; Sep. 11-15, 2006; 12 pages.

Kempe, et al.; "Protocols and Impossibility Results for Gossip-Based Communication Mechanisms:" Foundations of Computer Science, Jan. 2002; Proceedings. The $43^{rd}$ Annual IEEE Symposium; pp. 471-480.

Key, et al.; "Combining Multipath Routing and Congestion Control for Robustness;" In Proceedings of IEEE CISS, 2006, 6 pages.

Kim, et al.; "Modeling Network Coded TCP Throughout: A Simple Model and its Validation;" Valuetools '11 Proceedings of the $5^{th}$ International ICST Conference on Performance Evaluation Methodologies and Tools; May 16-20, 2011; 10 pages.

Kim, et al.; "Modeling Network Coded TCP Throughput: A Simple Model and its Validation", Cornell University Library, http://arxiv.org/abs/1008.0420, Aug. 2010, 3 pages.

Kim, et al.; "Network Coding for Multi-Resolution Multicast;" IEEE INFOCOM 2010; Mar. 2010; 9 pages.

Kim, et al.; "Transform-free analysis of the GI/G/1/K queue through the decomposed Little's formula;" Computers and Operations Research; vol. 30; No. 3; Mar. 2003; pp. 1-20.

Kim, et. al.: "Modeling Network Coded TCP Throughput: A Simple Model end its Validation", arXiv:1008.0420v1 [cs.IT] Aug. 2, 2010; 9 pages.

Kim, et al.; "Modeling Network Coded TCP Throughput: A Simple Model and its Validation", Nov. 2010, Presentation; 19 pages.

Kodialam, et al.; "Online Multicast Routing With Bandwidth Guarantees: A New Approach Using Multicast Network Flow;" IEEE/ACM Transactions on Networking: vol. 11; No. 4; Aug. 2003; pp. 676-686.

Koetter, et al.; "An Algebraic Approach to Network Coding;" IEEE/ACM Transactions on Networking; vol. 11, No. 5; Oct. 2003; pp. 782-795.

Koetter, et al.; "Beyond Routing: An Algebraic Approach to Network Coding;" IEEE Infocom; 2002; 9 pages.

Koutsonikolas, et al.; "Efficient Online WiFi Delivery of Layered-Coding Media using Inter-layer Network Coding;"Distributed Computing Systems (ICDCS); 2011 $31^{st}$ International Conference on Jun. 2011; 11 pages.

Kritner, et al.; "Priority Based Packet Scheduling with Tunable Reliability for Wireless Streaming;" Lecture Notes in Computer Science; 2004; pp. 707-717.

Kuhn, et al.; "Distributed Computation in Dynamic Networks;" Proc. Of the $42^{nd}$ Symposium on Theory of Computing (STOC); Jun. 5-8, 2010; 10 pages.

Larsson, et al.; "Analysis of Network Coded Hard for Multiple Unicast Flows;" Communication (ICC) 2010 IEEE international Conference on May 23-27, 2010 pp. 1-6.

Larsson, et al.; "Multi-User ARQ;" Vehicular Technology Conference; 2006; VTC (2006-Spring); IEEE $63^{rd}$; vol. 4; May 7-10, 2006; pp. 2052-2067.

Larsson; "Analysis of Multi-User ARQ with Multiple Unicast Flows Under Non-iid Reception Probabilities:" I. Wireless Communication and Networking Conference 2007; WCNC 2007; IEEE; Mar. 11-15, 2007; pp. 384-388.

Larsson; "Multicast Muitiuser ARQ;" Wireless Communications and Networking Conference (WCNC) 2008; IEEE; Apr. 3, 2008: pp. 1985-1990.

Le, et al.; "How Many Packets Can We Encode?—An Analysis of Practical Wireless Network Coding;" INFOCOM 2008; The $27^{th}$ Conference on Computer Communications, IEEE; 2008; pp. 1040-1048.

Lee, et al.; "Content Distribution in VANETs using Network Coding: The Effect of Disk I/O and Processing O/H;" Proc. IEEE SECON: Jan. 2008; pp. 117-125.

Lehman, et al.; "Complexity Classification of Network information Flow Problems;" SODA 04' Proceedings of the fifteenth annual ACM-SIAM symposium on Discrete algorithms; Jan. 2004; pp. 9-10.

Li, et al.; "N-in-1 Retransmission with Network Coding;" IEEE Transactions on Wireless Communications; vol. 9; No. 9; Sep. 2010; pp. 2689-2694.

Li, et al.; "Robust and Flexible Scalable Video Multicast with Network Coding over P2P Network:" $2^{nd}$ International Congress on Image and Signal Processing, IEEE: Oct. 17, 2009; pp. 1-5.

Li, et al.; "Linear Network Coding;" IEEE Transactions on Information Theory; vol. 49; No. 2, Feb. 2003; pp. 371-381.

Lima, et al.; "An Information-Theoretic Cryptanalysis of Network Coding—is Protecting the Code Enough;" International Symposium on Information Theory and its Applications; Dec. 2006; 6 pages.

Lima, et al.; "Random Linear Network Coding: A free cipher?" IEEE International Symposium on Information Theory; Jun. 2007; pp. 1-5

Lima, et al.; "Secure Network Coding for Multi-Resolution Wireless Video Streaming;" IEEE Journal on Selected Areas in Communications; vol. 26; No. 3; Apr. 2010; pp. 377-388.

Lima, et al.; "Towards Secure Multiresolution Network Coding;" IEEE Information Theory Workshop; Jun. 12, 2009; pp. 125-129.

Liu, et al.; "The Throughput Order of Ad Hoc Networks Employing Network Coding and Broadcasting;" Military Communications Conference; MILCOM 2006; Oct. 2008; pp. 1-7.

Liu, et al.; "Using Layered Video to Provide Incentives in P2P Live Streaming;" P2P-TV07: Proceedings of the 2007 Workshop on Peer-to-peer Streaming and IP-TV; Aug. 31, 2007 ACM; 6 pages.

Luby, et al.; "The Use of Forward Error Correction (FEC) in Reliable Multicast;" Internet Society Request for Comments; RFC 3453; Dec. 2002; 18 pages.

Lucani et al; "On Coding for Delay New Approaches based on Network Coding in Network Coding in Networks with Large Latency;" Presentation in NetCod; Slide Presentation; Jun. 16, 2009; 17 pages.

(56) References Cited

OTHER PUBLICATIONS

Lucani et al; "Broadcasting in Time-Division Duplexing: A Random Linear Network Coding Approach;" presented Switzerland; Conference. NetCod 2009, Lausanne, Switzerland; Jun. 2009; 6 pages.

Lucani et al; "On Coding for Delay—New Approaches Based on Network Coding in Networks with Large atency;" Conference: ITA Workshop, San Diego, USA; Feb. 2009; 10 pages.

Lucani et al; "On Coding for Delay New Approaches based on Network Coding in Networks with Large Latency;" Conference ITA Workshop, San Diego, USA; Slide Presentation; Feb. 13, 2009; 11 pages.

Lucani et al; "Random Linear Network Coding for Time Division Duplexing: Energy Analysis;" Conference: ICC 2009, Dresden, Germany; Jun. 2009; 5 pages.

Lucani et al; "Random Linear Network Coding for Time-Division Duplexing: when to stop taking and start listening," Presentation in ICC; Slide Presentation; Jun. 16, 2009; 6 pages.

Lucani et al; "Random Linear Network Coding for Time-Division Duplexing: when to stop talking and start listening;" Presentation in INFOCOM; Side Presentation; Apr. 23, 2009; 10 pages.

Lucani et al; "Random Linear Network Coding for Time-Division Duplexing: Queueing Analysis;" Conference ISIT 2009, Seoul, Korea; Jul. 2009; 5 pages.

Lucani et al; "Random Linear Network Coding for Time-Division Duplexing: Field Size Considerations;" onference: Globecom 2009, Hawaii, USA; Dec. 2009; 6 pages.

Lucani, et al.; "Network Coding for Data Dissemination: It Is Not What You Know, But What Your Neighbors Don't Know;" Modeling and Optimization in Mobile, AdHoc, and Wireless Networks 2009; WiOPT 2009; 7$^{th}$ International Symposium on Jun. 23-27, 2009; pp. 1-8.

Lucani, et al; "Network Coding Schemes for Underwater Networks," WUWNet 07; Sep. 14, 2007; pp. 25-32.

Lucani, et al.; "Systematic Network Coding for Time-Division Duplexing;" Proceedings of the IEEE International Symposium on Information Theory (ISIT); ; Jun. 13/18, 2010; pp. 2403-2407.

Lun, et al.; "Further Results on Coding for Reliable Communication over Packet Networks;" Information Theory, ISIT 2,005 Proceedings international Symposium on Sep. 4-9, 2005; 5 pages.

Lun, et al.; "On Coding for Reliable Communication Over Packet Networks;" Physical Communication; vol. 1; No. 1, Jan. 2008; pp. 10 pages.

Lun, et al.; "On Coding for Reliable Communication over Packet Networks;" LIDS Publication #2741; Jan. 2007; 33 pages.

Lun, et al.; An Analysis of Finite-Memory Random Linear Coding on Packet Streams, Modeling and Optimization in Mobile, Ad Hoc and Wireiess Networks; Apr. 3-6, 2006; pp. 1-6.

Lun; "Efficient Operation of Coded Packet Networks;" Ph .D. Dissertation; Massachusetts Institute of Technoogy; Jun. 2006; 130 pages.

Magli, et al., "An Overvierw of Network Coding for Multimedia Streaming;" IEEE International Conference; Jun. 28, 2009; pp. 1488-1491.

Mallat, et al.; "Adaptive Covariance Estimation of Locally Stationary Processes;" Annals of Statistics, vol. 28, No. 1; 1998: pp. 1-43.

Manssour, et al.; "A Unicast Retransmission Scheme based on Network Coding;" IEEE Transactions on Vehicular Technology; vol. 61; Issue 2; Nov. 2011; 7 pages.

Maymounkov, et al.; "Methods for Efficient Network Coding;" Proc. Of the 44$^{th}$ Allerton Conference on Communication, Control, and Computing, Sep. 2006; 10 pages.

Médard, et al.; "On Coding for Non-Multicast Networks;" invited paper, 41$^{st}$ Allerton Annual Conference on Communicationm Control; Outgrowth of supervised student research Publications of Muriel Médard and Computing; vol. 1; Oct. 2003; 9 pages.

Medard; "Some New Directions for Network Coding in Content Distribution", RLE, EEGS, MFT, Seminar to Alcatel Lucent, Nov. 2010, 29 pages.

Merchant, et al.; "Analytic Modeling of Clustered RAID with Mapping Based on Nearly Random Permutation;" IEEE Transactions on Computers; vol. 45; No. 3; Mar. 1996; pp. 367-373.

Metzner; "An Improved Broadcast Retransmission Protocol;" IEEE Transactions on Communications; vol. COM-32; No. 6; Jun. 1984; pp. 679-683.

Mosk-Aoyama et al.; "Information Dissemination via Network Coding;"ISIT 2006; IEEE: Jul. 9-14, 2006; pp. 1748-1752.

Moyer et al.; "A Survey of Security Issues in Multicast Communications;" IEEE Network; vol. 13; No. 6; Nov./Dec. 1999; pp. 12-23.

Nguyen, et al.; "Internet Media Streaming Using Network Coding and Path Diversity;" IEEE Global Telecommunications Conference; Nov. 30-Dec. 4, 2006; 5 pages.

Nguyen, et al.; "Wireless Broadcast Using Network Coding," Vehicular Technology IEEE Transactions on Feb. 2009; vol. 58; issue 2; 25 pages.

Nguyen, et al.; "Video Streaming with Network Coding;" Journal of Signal Processing Systems; vol. 59, Issue 3; DOI: 10.1007/s11286-009-0342-7: Jun. 2010; 25 pages.

Noguichi, et al.; "Performance Evaluation of New Multicast Architecture with Network Coding:" IEICE Transactions on Communication, E86-B; No. 6; Jun. 2003; 3 pages.

NS Version 1—LBNL Network Simulator; web page—http://ee.lel.gov/ns/; Mar. 21, 2011; 3 pages.

Nyandoro, et al.; "Service Differentiation in Wireless LANs based on Capture;" IEEE GLOBECOM 2005; vol. 6; Dec. 2005; 5 pages.

Oliveira, et al.; "A Network Coding Approach to Secret Key Distribution;" IEEE Transactions on Information Forensics and Security; vol. 3; No. 3; pp. 414-423; Sep. 2008.

ParandehGheibi, et al.; "Access-Network Association Policies for Media Streaming in Heterogeneous Environments;" Apr. 2010; pp. 1-8.

Peng, et al.; "Research on Network Coding based Hybrid-ARQ Scheme for Wireless Networks:" Communication Systems (ICCS); 2010 IEEE International Conference on Nov. 17.19, 2010; pp. 218-222.

Popovici, et al.: "Robust, Portable I/O Scheduling with the Disk Mimic;" Proc. USENIX Annual Tech. Conf. San Antonio, Texas, Jun. 2003; 14 pages.

Qureshi, et al.; "An Efficient Network Coding based Retransmission Algorithm for Wireless Multicast;" Personal, Indoor and Mobile Radio Communications, 2009 IEEE 20$^{th}$ International Symposium on Sep. 13-18, 2009; 5 pages.

Radunovic, et al.; "Horizon: Balancing TCP Over Multiple Paths in Wireless Mesh Network;" Proc. 14$^{th}$ ACM International Conference on Mobile Computing and Networking; Sep. 2008; 12 pages.

Ramanathan; "Multicast Tree Generation in Networks with Asymmetric Links;" IEEE Transactions on Networking; vol. 4; Aug. 1996; pp. 1-12.

Rezaee, et al,: "Multi Packet Reception and Network Coding:" Presentation at the 2010 Military Communications Conference Unclassified Technical Program; Nov. 2, 2010; 16 pages.

Rezaee, et al.; "An Analysis of Speeding Multicast by Acknowledgment Reduction Technique (SMART) with Homogeneous and Heterogeneous Links—A Method of Types Approach;" Signals, Systems and Computers (ASILOMAR) 2011 Conference; IEEE; Nov. 2011; pp. 21-27.

Rezaee, et al.; "Speeding Multicast by Acknowledgment Reduction Technique (SMART);" ArXiv:1104.2941v2 [cs.NI] Sep. 10, 2011; 6 pages.

Rezaee, et al.; "Speeding Muiticast by Acknowledgment Reduction Technique (SMART) Enabling Robustness of QoE to the Number of Users;" IEEE Journal on Selected Areas in Communication; vol. 30, No. 7; Aug. 2012; pp. 1270-1280.

Rezaee, et al.; "Multi Packet Reception and Network Coding;" Military Communications Conference; 2010; MILCOM 2010; IEEE; Oct. 31, 2010-Nov. 3, 2010; pp. 1393-1398.

Rezaee; "Network Coding, Multi-Packet Reception, and Feedback: Design Tools for Wireless Broadcast Networks;" Submitted to Department of Electrical Engineering and Computer Science at Massachusetts Institute of Technology; Sep. 2011; 92 pages.

(56) References Cited

OTHER PUBLICATIONS

Riemensberger, et al.; "Optimal Slotted Random Access in Coded Wireless Packet Networks:" WiOPt 10: Modeling and Optimization in Mobile, Ad Hoc, and Wireless Networks; Jul. 13, 2010; pp. 374-379.

Roughgarden, et al.; "How Bad is Selfish Routing?" Journal of the ACM; vol. 49, No. 2; Mar. 2002; pp. 236-259.

Ruemmler, et al.; "An introduction to disk drive modeling;" IEEE Computers; vol. 27; No. 3, Mar. 17-29, 1994; 17 pages.

Ryabko, et al.; "On Hypotheses Testing for Ergodic Processes;" Information Theory Workshop; ITW'08; IEEE; 2008; pp. 231-283.

Sanders, et al.; "Polynomial Time Algorithms for Network Information Flow;" 15th ACM Symposium on Parallel Algorithms and Architectures; Jun. 2003; pp. 1-9.

Sayenko, et al.; "Performance Analysis of the IEEE 802.16 ARQ Mechanism;" MSWIM'07: Oct. 22-26, 2007; pp. 314-322.

Scharf; "MPTCP Application Interface Considerations draft-scharf-mptcp-ap-04;" Internet Engineering Task Force: Internet-Draft; Nov. 22, 2010; 26 pages.

Seferogiu, et al.; "Opportunistic Network Coding for Video Streaming over Wireless;" Packet Video; Nov. 2007; 10 pages.

Sengupta, et al.; "An Analysis of Wireless Network Coding for Unicast Sessions: The Case for Coding-Aware Routing:" in INFOCOM 2007; 26th IEEE international Conference on Computer Communications; Jun. 2007; 9 pages.

Servatto, et al.; "Constrained Random Walks on Random Graphs: Routing Algorithms for Large Scale Wireless Sensor Networks;" WSNA 02; Sep. 28, 2002; 10 pages.

Shenker, et al.; "Pricing in computer networks: reshaping the research agenda;" Telecommunications Policy; vol. 20, No. 3; Jan. 1996; pp. 183-201.

Sherali, et al.; "Recovery of primal solutions when using subgradient optimization methods to solve Lagrangian duals of linear programs;" Elsevier Operations Research Letters 19 (Jan. 1996); pp. 105-113.

Shields; "The Interactions Between Ergodic Theory and Information Theory;" IEEE Transactions on Information Theory, vol. 44, No. 6: Oct. 1998; pp. 2079-2093.

Shrader, et al.: "Systematic wireless network coding:" Military Conference, 2009; MILCOM 2009; IEEE; 7 pages.

Shrader, et al.; "Routing and Rate Control for Coded Cooperation in a Satellite-Terrestrial Network;" IEEE: The 2011 Military Communications Conference—Track 2—Network Protocols and Performance; Nov. 7-10, 2011; pp. 735-740.

Shriver, et al.; "An analytic behavior model for disk drives with readaheed caches and request reodering;" Proc. SIGMETRICS/Performance, Joint Conf, on Meas. and Modeling. Comp, Sys.; ACM; Jan. 1998; 10 pages.

Song, et al.; "Zero-Error Network Coding for Acyclic Networks;" IEEE Transactions on Information Theory; vol. 49, No. 12; Dec. 2003; pp. 3129-3139

SongPu, et al.; Performance analysis of joint chase combining and network coding in wireless broadcast retransmission; Wireless Communication, Network and Mobile Computing 2008; WiCOM '08, 4th International Conference on Oct. 12-14, 2008; pp. 1-4

Soo Suh; "Send-On-Delta Sensor Data Transmission With a Linear Predictor;" Sensors; ISSN 1424-8220; vol. 7; No. 4; Apr. 26, 2007; pp. 537-547.

Sun, et al.; "Cooperative Hybrid-ARQ Protocol with Network Coding;" Communications and Networking in China 200 —ChinaCOM 2009; Fourth international Conference on Aug. 26-28, 2009; pp. 1-5.

Sundaram et al.; "Multirate Media Streaming Using Network Coding;" Proc. 43rd Allerton Conference on Communication, Control, and Computing; Sep. 2005; 7 pages.

Sundararajan, et al.; "ARQ for Network Coding;" ISIT Proc. Of the IEEE International Symposium on Information Theory (ISIT); Jul. 6-11, 2008; pp. 1651-1655.

Sunderarajan, et al.; "Network Coding Meets TCP: Theory and Implementation;" Proceedings of the IEEE; vol. 99, issue 3; Mar. 2011; pp. 490-512.

Sundararajan, et al.; "Network coding meets TCP;" InfoCOM 2009; IEEE, Apr. 19-25, 2009; pp. 280-288.

Sundararajan, et al.; On Queueing in Coded Networks—Queue Size Foiiows Degrees of Freedom; IEEE Information Theory Workshop on Information Theory for Wireless Networks (ITW); Jul. 1-6, 2007; 6 pages.

Teerapittayanon, et al.; "Network Coding as a WiMAX Link Reliability Mechanism;" Multiple Access Communication; Lectures Notes in Computer Science; vol. 7642; pp. 1-12; 2012

Teerapittayanon, et al.; "Performance Enhancements in Next Generation Wireless Networks Using Network Coding: A Case Study in WiMAX;" Massachusetts Institute of Technology; Jun. 2012; 130 pages.

Thobaben; "Joint Network/Channel Coding for Multi-User Hybrid-ARQ;" Source and Channel Coding (SCC) 2008; 7th International ITG Conference on Jan. 14-16, 2008; 6 pages.

Tosun, et al.; "Efficient Multi-Layer Coding and Encryption of MPEG Video Streams;" Proc. 2000 IEEE International Conference on Multimedia and Expo; vol. 1; 2000; pp. 119-122.

Tosun, et al.; "Lightweight Security Mechanisms for Wireless Video Transmission;" Proc. Intl. Conference on Information Technology, Coding and Computing; Apr. 2001; pp. 157-161, Tran, et al.; "A Hybrid Network Coding Technique for Single-Hop Wireless Networks;" IEEE Journal on Selected Areas in Communications; vol. 27; No. 5; Jun. 2009; pp. 685-698.

Tran, et al.; "A Joint Network-Channel Coding Technique for Single-Hop Wireless Networks;" Network Coding, Theory and Applications; 2008; NetCod 2008; Fourth Workshop on Jan. 3-4, 2008; pp. 1-6.

Trung, et al.; "Quality Enhancement for Motion JPEG Using Temporal Redundancies;" IEEE Transactions on Circuits and System for Video Technology, vol. 18; No. 5; May 2008; pp. 609-819.

Tsatsanis, et al.; "Network Assisted Diversity for Random Access Wireless Data Networks;" Signals, Systems & amp; Computers; IEEE; vol. 1; Nov. 1-4; 1980; pp. 83-87.

Valancius, et al.; "Greening the Internet with Nano Data Centers;" Proc. 5th International Conference on Emerging Networking Experiments and Technologies; CoNEXT 2009; ACM 2009; Dec. 1-4, 2009; pp. 37-48.

Vasudevan, et al.; "Algebraic Gossip on Arbitrary Networks;" arXiv:0901.1444; Jan. 2009; 5 pages.

Velambi, et al.; "Throughput and Latency in Finite-Buffer Line Networks;" Transactions on Information Theory; vol. 57; No. 6; Jun. 2011; pp. 3622-3643.

Vien, al.; "Network Coding-based Block ACK for Wireless Relay Networks;" Proceedings of IEEE Vehicular Technology Conference (VTC2011-Spring): May 2011; 5 pages.

Vien, et al.; "Network Coding-based ARQ Retransmission Strategies for Two-Way Wireless Relay Networks;" Software, Telecommunications and Computer Networks (SoftCOM) 2010; International Conference on Sep. 23-25, 2010; 5 pages.

Vilela et al.; "Lightweight Security for Network Coding;" IEEE International Conference on Communications; May 2008; 5 pages.

Wang, et al.; "Capacity-Delay Tradeoff for Information Dissemination Modalities in Wireless Networks;" in Information Theory; ISIT 2008; IEEE International Symposium; Jul. 2008; pp. 677-651.

Wang, et al.; "Embracing interference in Ad Hoc Networks Using Joint Routing and Scheduling with Multiple Packet Reception;" in INFOCOM 2008; The 27th Conference on Computer Communications; IEEE; Apr. 2008; pp. 1517-1525.

Wang, et al.; Multipath Live Streaming via TCP: Scheme, Performance and Benefits; ACM Transactions on Multimedia Computing, Communications and Applications; vol. 5; No. 3; Article 25; Aug. 2009; pp. 1-23.

Widmer, et al.; "Network Coding for Efficient Communication in Extreme Netowrks;" Applications; Technologies, Architectures, and Protocols for Computer Communication; Aug. 2005; pp. 284-291.

Wieselthier, et al.; "Energy Efficient Broadcast and Multicast Trees in Wireless Networks;" Mobile Networks and Applications 7; Jan. 2002; pp. 481-492.

(56) References Cited

OTHER PUBLICATIONS

Wieseithier, et al.; "Energy-Aware Wireless Networking with Directional Antennas: The Case of Session-Based Broadcasting and Multicasting;" IEEE Transactions on Mobile Computing; vol. 1, No. 3; Jul.-Sep. 2002; pp. 176-191.

Wilhelm; "An Anomaly in Disk Scheduling: A Comparison of FCFS and SSTF Seek Scheduling Using an Empirical Model for Disk Access;" Communications of the ACM, vol. 19; No. 1; Jan. 1976; pp. 13-17.

Wu, et al.; "A Trellis Connectivity Analysis of Random Linear Network Coding with Buffering;" Proc. Of the International Symposium on Information Theory (ISIT); Jul. 9-14, 2006; pp. 768-772.

Yazdi, et al.; "Optimum Network Coding for Delay Sensitive Applications in WiMAX Unicast;" IEEE INFOCOM 2009; Apr. 19-25, 2009; pp. 1576-2580.

Yeung; "Multilevel Diversity Coding with Distortion;" IEEE Transactions on Information Theory; vol. 41, No. 2; Mar. 1995; pp. 412-422.

Yong, et al.; "XOR Retransmission in Multicast Error Recovery;" Networks 2000; ICON; Proceedings IEEE International Conference on Sep. 5-8, 2000; pp. 336-340.

Yun, et al.; "High-Throughput Random Access Using Successive Interference Cancellation in a Tree Algorithm;" IEEE Transactions on Information Theory; vol. 53; No. 12; Dec. 2007: pp. 4628-4639.

Yun, et al.; Towards Zero Retransmission Overhead: A Symbol Level Network Coding Approach to Retransmission; IEEE Transactions on Mobile Computing; vol. 10; No. 8; Aug. 2011; pp. 1088-1095.

Zeger; "Packet Erasure Coding with Random Access to Reduce Losses of Delay Sensitive Multislot Messages;" IEEE; Paper ID #900482; Aug. 18, 2009; pp. 1-8.

Zhang, et al.; "Collision Resolution in Packet Radio Networks Using Rotational Invariance Technioues;" IEEE Transactions on Communication; vol. 80; No. 1; Jan. 2002; pp. 146-155.

Zhang, et al.; "Optimized Muitipath Network Coding in Loss Wireless Networks;" ICDCS '08 Proceedings of the 2008 The $28^{th}$ International Conference on Distributing Computing Systems; Jan. 2008; 12 pages.

Zhang, et al.; Dual XOR In the AIR: A Network Coding Based Retransmission Scheme for Wireless Broadcasting; Communications (ICC) 2011 IEEE International Conference on Jun. 5-9, 2011; pp. 1-6.

Zhao, et al.; "A Multiqueue Service Room MAC Protocol for VVireless Networks With Multipacket Recepton;" IEEE/ACM Transactions on Networklng; vol. 11; No. 1; Feb. 2003; pp. 125-137.

Zhao, et al.; "On analyzing and improving COPE performance;" Information Theory and Applications Workshop (ITA), Jan. 2010; pp. 1-6.

Zhu; et al.; "Multicast with Network Coding in Application-Layer Overlay Networks;" IEEE Journal on Selected Areas in Communications; vol. 22; No. 1; Jan. 2004; pp. 1-13.

U.S. Appl. No. 14/297,090, filed Jun. 5, 2014, Kim et al.

U.S. Appl. No. 14/678,359, filed Apr. 3, 2015, Zeger et al.

U.S. Appl. No. 14/668,185, filed Mar. 25, 2015, Medard et al.

\* cited by examiner

ENERGY-EFFICIENT TIME-STAMPLESS ADAPTIVE NONUNIFORM SAMPLING

CROSS REFERENCE TO RELATED APPLICATIONS

This application claims the benefit of U.S. Provisional Application No. 61/504,440, which is hereby incorporated by reference in its entirety.

GOVERNMENT RIGHTS

This invention was made with government support under Contract No. FA9550-09-1-0196 awarded by the Air Force Office of Scientific Research. The government has certain rights in this invention.

FIELD OF THE INVENTION

The concepts described herein relate to sampling and more particularly to adaptive nonuniform sampling schemes.

BACKGROUND OF THE INVENTION

As is known in the art, there is an increasing trend for mobile phones, "smart" phones, sensors and other light-weight and battery-operated devices to increasingly affect the everyday life of human's. Such devices have already started to become more and more intelligent, equipped with a wide range of features.

The majority of these devices, however, are resource constrained. For example, the devices are typically powered by batteries, or even by energy scavenging, and thus the devices typically have strict power budgets. Thus, reducing power consumption of such devices is beneficial for battery lifetime.

One problem, however, is that many applications require such devices to continuously measure different quantities such as voice, acceleration, light or voltage levels. After processing these quantities and extracting required features, the devices then typically communicate information to humans or to other devices. A concern in all of these applications is the large amount of power which is consumed to continuously sample, process and transmit information.

As is also known, a significant challenge is posed by sampling a signal while at the same time trying to satisfy sampling rate and reconstruction error requirements. This is particularly true in certain applications within the signal processing domain. It should be appreciated that in many applications, energy consumed during a sampling process can be a significant part of a system's energy consumption.

A variety of sampling techniques are known. Sampling techniques which follow a Nyquist sampling theorem utilize an appropriate uniform sampling setup for band-limited deterministic signals. One problem with such an approach, however, is that some samples may be redundant because the maximum bandwidth of the signal may not be a good measure of signal variations at different times. Redundant samples result in extra power consumption in the sampling procedure as well as in processes which follow the sampling. For example, if it is necessary, to transmit samples to another location, having a relatively large number of additional samples results in higher transmission energy and/or in extra energy spent for compressing the samples.

As a way to more efficiently sample a signal, adaptive nonuniform sampling schemes have been proposed. Such adaptive nonuniform sampling schemes result in reduced power consumption since the number of redundant samples is decreased or, in some cases, even eliminated.

Several non-uniform adaptive sampling schemes are known. For instance, a non-uniform sampling scheme based upon level-crossings with iterative decoding has been proposed as has an approach based upon level crossings with a filtering technique which adapts the sampling rate and filter order by analyzing the input signal variations. Also, two adaptive sampling schemes for band-limited deterministic signals have also been proposed. One scheme is based upon linear time-varying low pass filters and another scheme is based upon time-warping of band-limited signals.

Such non-uniform sampling schemes give rise to at least two problems which make it difficult to apply these schemes in practical applications. First, non-uniform sampling schemes are designed for specific signal models (i.e., they are not generic). This is because it is difficult to determine the next sampling time step at each time (i.e. rate control). Second, it is necessary to keep (e.g. store) or transmit sampling times since they are required in the reconstruction process.

For a discrete stochastic signal, one sampling scheme samples uniformly at a fixed high sampling rate (e.g. using an analog to digital converter (ADC)). Source coding is then used to compress these samples approximately to their entropy rate before transmission. While this technique is theoretically optimal, in practice this technique has some inefficiencies in terms of extra sampling and processing power required. Moreover, to achieve desired performance levels, long blocks of samples are necessary to be able to use source coding efficiently. This is particularly true if statistical properties of the signal vary slowly in time. This block-based approach may lead to a large delay on the reconstruction side.

It would therefore, be desirable, to provide an adaptive, nonuniform sampling technique which is generic (i.e. can be used in a wide variety of applications) and which does not need to store or transmit sampling times.

SUMMARY OF THE INVENTION

It has, in accordance with the concepts, systems and techniques described herein, been recognized that a smart sampling scheme should take samples as needed for a particular application (i.e., the technique should utilize innovative samples). This approach leads to an adaptive sampling scheme which inherently is nonuniform.

With this understanding, a general technique for efficiently sampling signals in an adaptive way is provided. The technique reduces (or in some cases, even minimizes) a required sampling rate and therefore the energy consumed during a sampling process. Thus, the technique described herein can greatly improve the energy consumption of a device.

The adaptive nonuniform sampling framework described herein has two characteristics. First, the adaptive nonuniform sampling framework takes samples only when they are innovative for the considered application. This reduces the number of required measurements. Second, unlike traditional nonuniform sampling procedures, sampling times need not be transmitted since the receiver can recover them within the context of the framework. This saves transmission rate and power. This technique (or sampling framework) is referred to herein as Time-Stampless Adaptive Nonuniform Sampling (TANS) or Energy-Efficient TANS (ETANS). TANS can be used in a wide variety of applications including but not limited to modem systems to provide significant rate and power benefits.

One key idea of the TANS technique described herein is that time intervals between samples can be computed by using a function of previously taken samples. Therefore, keeping sampling times (time-stamps), except initialization times, is not necessary. The aim of this sampling framework is to have a balance between the reconstruction distortion and the average sampling rate. The function by which sampling time intervals can be computed is referred to as a sampling function.

This sampling structure can be applied appropriately on different signal models such as deterministic or stochastic, and continuous or discrete signals, and for each, a different sampling function can be derived.

In contrast to schemes which take samples of discrete stochastic signals uniformly at a fixed high rate using an ADC, the techniques described herein takes samples when they are innovative. Since the power consumed during the sampling process depends linearly on the sampling frequency, the time-stampless, adaptive, nonuniform sampling techniques described herein are more efficient in terms of power and processing time, than prior art techniques which uniformly sample at a fixed high rate using an ADC.

Furthermore, in contrast to block-based approaches which may lead to a large delay on the reconstruction side, the techniques described herein correspond to substantially real-time delay-free compression schemes. These schemes adaptively compress the signal by using local properties of the signal causally which results in reduced power consumption.

In one embodiment, a sampling family which can be applied on both deterministic and stochastic signals, satisfying sampling and reconstruction requirements is described. This sampling family is a class of locally adaptive sampling (LAS) schemes. In this sampling family, time intervals between samples are computed via a sampling function which is based upon previously taken samples. Hence, although it is a non-uniform sampling scheme, it is not necessary to keep sampling times. Thus, in accordance with the present concepts, system and techniques described herein, described herein is a real-time compression scheme which adaptively compresses a signal by using its local properties causally.

In one embodiment, the aim of LAS is to have the average sampling rate and the reconstruction error satisfy some requirements. Four different schemes of LAS are described herein with two schemes being designed for deterministic signals and two schemes being designed for stochastic signals.

In the schemes designed for deterministic signals, a Taylor Series Expansion (TSE) sampling function is derived. In one embodiment, the TSE assumes only that the third derivative of the signal is bounded, but requires no other specific knowledge of the signal. Then, a Discrete Time-Valued (DTV) sampling function is proposed, where the sampling time intervals are chosen from a lattice.

In the schemes designed for stochastic signals, two sampling methods based upon linear prediction filters are described. A first sampling method is a Generalized Linear Prediction (GLP) sampling function, and a second sampling function is a Linear Prediction sampling function with Side Information (LPSI). In the GLP method, one only assumes the signal is locally stationary. However, LPSI is specifically designed for a known signal model.

With this particular arrangement, an adaptive, nonuniform sampling framework which can be used on both deterministic and stochastic signals is provided. By taking samples only when they are innovative for the considered application, the number of required measurements is reduced. Also, since the receiver can recover the sample times, and a continuous stream of sampling times need not be transmitted. This saves transmission rate and power.

It should be noted that in conventional nonuniform sampling procedures, sampling times must be transmitted to the receiver which impacts the system transmission rate and also utilizes power.

It should be appreciated that sampling functions can use either fixed or variable window sizes. Alternatively still, a combination of both fixed and variable window sizes can be used. In systems which utilize a variable window size, the system dynamically learns to adjust the window (e.g. the number of samples) for a particular signal. In a fixed window system, the number of samples to use in a window is selected based upon the needs of the particular application. For applications which require a high degree of accuracy, a relatively large number of samples in each window is required (i.e. need a large M). Some factors to consider in selecting number of samples to use in a window include buffer size since the larger the value of M, the larger the buffer which will be needed. It should also be appreciated that the higher the value of M, the more complicated the implementation. Thus, a trade-off must be made between the number of samples needed, the power consumption, and the ability to predict the future of the next window with a desired level of accuracy.

For stochastic signals the sampling function prediction can be based upon a plurality of different methods such as a greedy Method or a Dynamic Programming Based Method. For deterministic signals, a Taylor Series Expansion or a Discrete-Time Valued Method can be used. In operation, the future of the signals is predicted, then depending upon the allowed distortion (or other error value or metric), the next sample is taken.

Thus, the general framework described herein provides at least two advantages: (1) the system is adaptive—i.e. it is possible to change time intervals based upon variations (ideally this is inherently in the design of the sampling function which is chosen); and (2) the system is time-stamp-less—i.e. there is no need to store or transmit sampling times after the first M sampling times because those times after the first M sampling times can be computed using the sampling function.

Schemes of TANS may be categorized into parametric and non-parametric methods. In parametric methods, the signal model is known a priori and the sampling function is designed for that model. In non-parametric schemes, the signal model is not known (or is known partially) and the sampling function learns the necessary characteristics of the signal by using the taken samples.

It should be appreciated that in the case of stochastic signals, there are primarily two general techniques for designing a sampling function: (1) a greedy sampling Function; (2) dynamic programming based methods; (or approximate dynamic programming based methods).

In the greedy approach, the system takes the next sample to minimize the sum of reconstruction costs and a sampling rate penalty.

Dynamic programming based methods are similar to the greedy method, but they also consider quality (Q) of the next sampling prediction or state. Thus, in the DP approach, the concept is trade-off between a present state and a future state (e.g. allow lower performance in a present state to improve a future state).

In accordance with one aspect of the concepts described herein, a method of designing a sampling function includes (a) obtaining an initial number of samples; (b) predicting a future sample upon the initial number of samples; (c) computing an error value of the predicted future sample; (d)

comparing the error value to a threshold value (e.g. allowed distortion); (e) in response to the error value exceeding the threshold value, taking a sample; and (f) in response to the error value not exceed the threshold value increasing the sampling time and computing a new predicted future sample.

With this particular arrangement, a technique for adaptive, time-stamp-less sampling is provided. The technique is adaptive since it is possible to change time intervals based upon signal variations. In some embodiments, this characteristic is a result of a design of a selected sampling function. The technique is time-stamp-less since there is no need to store or transmit sampling times after the first M sampling times because those times after the first M sampling times can be computed using the sampling function.

In accordance with a further aspect of the concepts described herein, a method of sampling includes (a) obtaining samples of a signal; and (b) computing a next sample time only as a function of the previously taken samples.

With this particular arrangement, an adaptive and time-stampless sampling technique is provided. In one embodiment, computing a next sample time as a function of previously taken samples is performed by computing a next sample time as a function of only a predetermined number of previously taken samples (e.g. M previously taken samples).

In accordance with a still further aspect of the concepts described herein, a sampling method includes (a) obtaining M samples of a signal; and (b) computing a next sample time as a function of only M previously taken samples of the signal wherein the sampling is adaptive and self-synchronizing. The method further includes (c) recovering sampling times using only the sample values and the first M sample times taken of the signal.

In accordance with yet a further aspect of the concepts, systems, and techniques described herein, a sampling system and method in which time intervals between samples are computed as a function of previously taken samples is described. With this technique, sample intervals are computed via a sampling function corresponding to a time-stampless adaptive nonuniform sampling technique.

In accordance with a further aspect of the concepts, system and techniques described herein, a locally adaptive sampling (LAS) system and method designed for deterministic signals is described. In one embodiment, the system and method utilize a Taylor series expansion (TSE) sampling function. In one embodiment, the TSE only assumes the third derivative of the signal is banded (but requires no other specific knowledge of the signal)

In accordance with a still further aspect of the concepts, systems and techniques described herein, locally adaptive sampling (LAS) system and method for deterministic signals which utilizes a discrete time-valued (DIV) sampling function is described. In one embodiment, the LAS system and method utilize sampling time intervals are chosen from a lattice.

In accordance with a still further aspect of the concepts, systems and techniques a locally adaptive sampling (LAS) system and method for stochastic signals comprise a sampling method based upon a linear prediction filter which utilizes a linear prediction (LP) sampling function with side information (LPSI). This technique is specifically designed for a known signal model.

In one embodiment, a locally adaptive sampling (LAS) system and method utilizes sampling time intervals which are discrete values.

In one embodiment, a locally adaptive sampling (LAS) system and method for discrete stochastic signals utilizes a sampling function based upon a generalized linear prediction (GAP) filter. In one embodiment, this technique assumes that the signal is locally stationary.

In accordance with a still further aspect of the concepts, systems and techniques, a method for providing an appropriate sampling function for a time-stampless adaptive nonuniform sampling (TANS) system and method is described. Factors to consider in providing a sampling function include, but are not limited to: the particular application (e.g. the characteristics of the signals involved), the signal model, the reconstruction method and sampling requirements (e.g. sampling rate, distortion requirements, etc.).

BRIEF DESCRIPTION OF THE DRAWINGS

The foregoing features of this invention, as well as the invention itself, may be more fully understood from the following description of the drawings in which.

DETAILED DESCRIPTION OF ILLUSTRATIVE EMBODIMENTS

Before describing a system and process for a process for time-stampless adaptive nonuniform sampling (TANS), some introductory concepts and terminology are explained.

A deterministic signal is a signal which can be described by analytical expressions for all times (past, present, future). Thus, deterministic signals are predictable for arbitrary times and can be reproduced identically arbitrarily often.

A stochastic signal may be an analog or continuous parameter signals or may be made up of a plurality of discrete values (a so-called discrete stochastic signal) which is often represented as X(n) where n takes on a plurality of discrete values.

It should be appreciated that the systems and processes described herein for time-stampless adaptive nonuniform sampling can be applied to either deterministic or stochastic signals which are either continuous or discrete. Accordingly reference to or exemplary embodiments described herein which use continuous parameter signals should not be construed as limiting. Rather such examples are provided only to promote clarity in the text and to promote clarity of the broad concepts described herein related to the adaptive, nonuniform sampling framework.

Reference is sometimes made herein to specific applications. For example, energy efficient sampling and communication systems and health care/monitoring systems. It should be appreciated that the systems and processes described herein for time-stampless adaptive nonuniform sampling can be applied to a wide variety of different applications. In a broad sense, sampling can be considered as a query for information. The systems and techniques described herein can be used in any applications where it is necessary to reconstruct some function f(t) that can only be measured remotely. The systems and techniques described herein allow one to obtain a sample of the function f(t) at an arbitrary time when it is queried (e.g. queried over some communication medium). In such an application, a portion of the operational cost (e.g. power) is proportional to the number of samples which are obtained. It should be appreciated that in some applications, this part of the operational cost is dominant. Thus, in such applications, the systems and techniques described herein result in large operational cost benefits (e.g. less power consumption).

Figure 1:
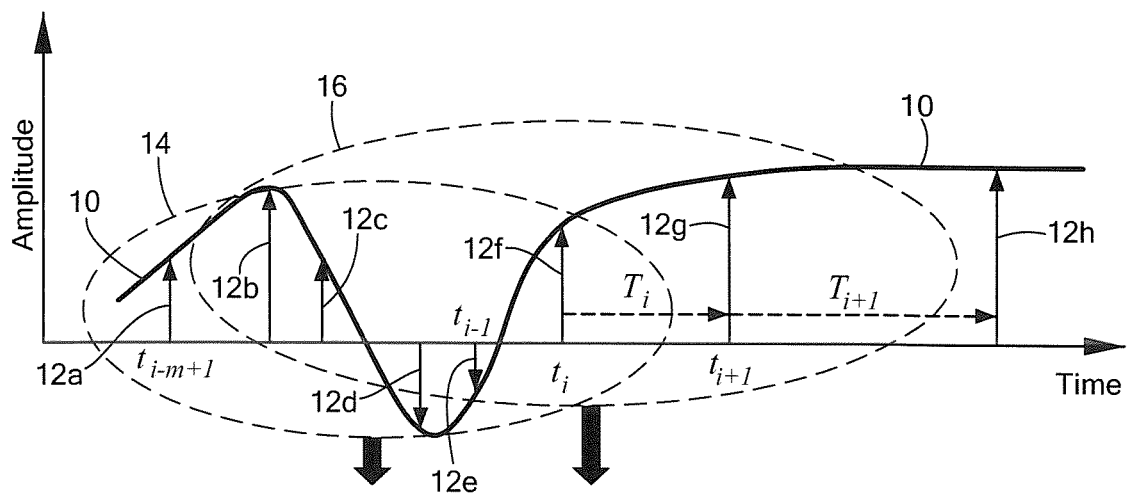
FIG. 1 is a plot of an amplitude of a continuous signal vs. time.

Referring now to FIG. 1, a time varying continuous signal 10 has a plurality of samples 12a-12h taken therefrom. A first plurality of samples, here samples 12a-12f, are taken inside a first window 14. In general, the first M samples are taken in the first window 14 at times $t_{i-m+1}$ through $t_i$. In the particular example of FIG. 1, M=6. Those of ordinary skill in the art will appreciate, however, that fewer or less than six (6) samples may be used. The particular number of samples M to use in any particular application depends upon a variety of factors.

FIG. 1 also illustrates a second window 16 which is the same size as first window 14 in terms of the number of samples. Thus, in this exemplary embodiment, window 16 also includes six (6) samples corresponding to samples 12b-12g. Thus, in this exemplary embodiment a fixed window size is used. It should, however, be appreciated that in other embodiments a variable window size may be used (i.e. the windows need not contain the same number of samples).

In operation, the future of the signals is predicted, then depending upon the allowed distortion (or other error value or metric), the next sample is taken.

With the above arrangement, $T_i$ may be expressed as $$T_i = f(X(t_i), \ldots T_{i+1}) = f(X(T_{i+1}), \ldots X(T_{i-m+2}), t_{i+1}, \ldots t_{i-m+2})$$

In this example, a sampling function with order M may be represented as f(.). It should be noted the sampling function is a function of previously taken samples as opposed to being a function of the entire signal. By not depending upon the entire signal, if the signal has a low signal variation, then the sampling time is increased (i.e. the time between samples is increased). On the other hand, if the signal has a high signal variation, then the sample time is decreased (i.e. the time between samples is decreased). It should also be noted that it is not necessary to keep sampling times.

Designing appropriate sampling functions depends upon a variety of factors including, but not limited to the application, the signal model, the reconstruction method, other reconstruction requirements, the sampling rate, the allowed distortion level, etc. . . . .

For example, in a medical application such as a continuous health monitoring application, such as monitoring an EKG signal, the EKG signal is known to contain both low and high frequency components. In this case, a generic sampling function (as opposed to an application specific sampling function) can be used. In one embodiment, a generic sampling function can be derived by using a Fourier Transform and the Cauchy-Schwarz inequality:

$$T_i = \left(\frac{p}{c}\frac{1}{w(t_i)^2}\right)^{1/3}$$

where $$w(ti) = \left|\frac{X_{(t_i)} - X_{(t_{i-1})}}{t_i - t_{i-1}}\right|$$

where
  $w(t_i)$ is an approximation of the signal slope at time $t_i$;
  c is a sampling parameter; and
  p is the signal power.

It should be noted that the higher the derivative at time $t_i$, the higher the signal variations at this time and thus, the smaller the sampling step size.

An example of a sampling function with discrete steps is $$T_i = \begin{cases} T_{i-1} + \epsilon & w(ti) < th_1 \\ T_{i-1}th, & \leq w(ti) \leq th_2 \\ T_{i-1} - \epsilon' & w(ti) \geq th_2 \end{cases}$$

in which $$w(ti) = \frac{\left|\frac{X_{ti} - t_{i-1}}{T_{i-1}} - \frac{X_{(ti-1)} - X_{(ti-2)}}{T_{i-2}}\right|}{(T_{i-1} + T_{i-2})/2}$$

As noted above, the sampling structure described above can be used with both deterministic and stochastic modeling and analysis. For example, Taylor Series Expansions and Discrete-Time Valued methods can be used for deterministic signals while for stochastic signals the prediction can also be based upon a plurality of different methods such as a greedy Method, a Dynamic Programming Based method or a Generalized Linear Prediction method.

It should be appreciated that while the same number of samples are used in windows 14, 16 (i.e. fixed window sizes), variable window sizes can also be used.

In a fixed window system, a number of samples to use in a window are selected based upon the needs of the particular application. For applications which require a high degree of accuracy, a relatively large number of samples in each window is required (i.e. need a large M). Some factors to consider in selecting number of samples to use in a window include buffer size since the larger the value of M, the larger the buffer which will be needed. It should also be appreciated that the higher the value of M, the more complicated the implementation. Thus, a trade-off must be made between the number of samples needed, the power consumption, and the ability to predict the future of the next window with a desired level of accuracy.

In systems which utilize a variable window size, the system dynamically learns how to adjust the window (e.g. the number of samples) for a particular signal.

It should also be appreciated that a combination of both fixed and variable window sizes can be used and that some systems may dynamically change between fixed and variable window sizes.

Thus, the general framework described herein provides at least two advantages: (1) the sampling system is adaptive— i.e. it is possible to change time intervals based upon variations (ideally this is inherently in the design of the sampling function which is chosen); and (2) the sampling system is time-stamp-less—i.e. there is no need to store or transmit sampling times after the first M sampling times because those times after the first M sampling times can be computed using the sampling function.

As mentioned above, in the case of stochastic signals, there are primarily two general techniques for designing a sampling function: (1) a greedy Sampling Function; (2) Dynamic Programming Based Methods; (or approximate dynamic programming based methods). In the greedy approach the system takes the next sample to minimize the sum of reconstruction costs and a sampling rate penalty. Dynamic programming based methods are similar to the greedy method, but they also consider quality (Q) of the next sampling prediction or state. Thus, in the DP approach, the concept is trade-off between a present state and a future state (e.g. allow lower performance in a present state to improve a future state).

Figure 2:
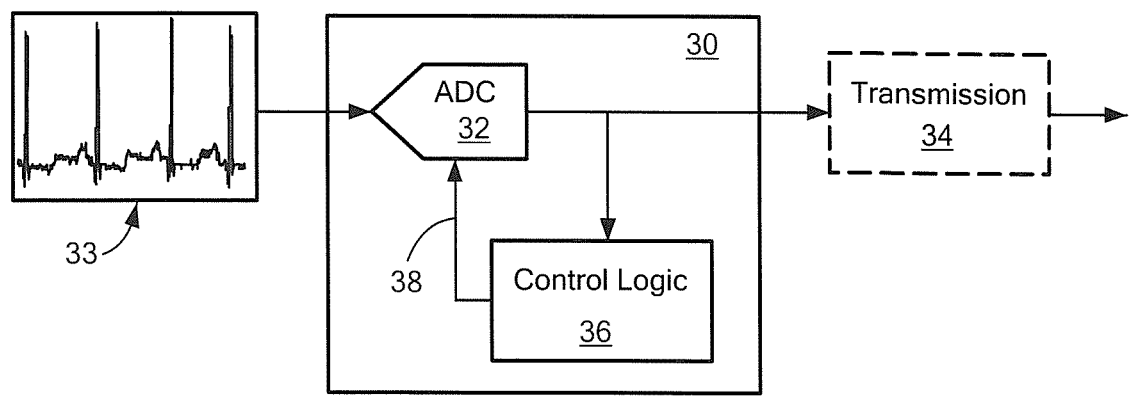
FIG. 2 is a block diagram of a system for sampling and transmitting data.

Referring now to FIG. 2, a sampling and transmission system includes a processing device 30 which comprises an analog to digital converter (ADC) 32 which samples or converts signals 33 provided thereto into a stream of bits which may be grouped as digital words. Signal 33 may correspond to either deterministic or stochastic signals which are either continuous (analog) or discrete.

ADC 32 operates in accordance with a sampling function which defines a time-stampless, arbitrary and nonuniform sampling rate. The particular sampling function selected for any particular application is selected based upon a variety of factors related to the requirements of the particular application including, but not limited to factors such as the particular application, the signal model, the reconstruction method, other reconstruction requirements, the sampling rate and the allowed distortion level.

At the output of ADC 32, the stream of digital words are coupled to a transmission device 34 and also to a control logic element 36. Control logic element 16 may include a buffer memory element (not shown in FIG. 2) and may be under control of a system controller (not shown in FIG. 2) via control signals on control lines (not shown in FIG. 2). The sampling rate of ADC 32 is under control of control logic element 36 via control signals on control lines 38 (i.e. control logic element 36 implements the sampling function). After a sufficient amount of data has been collected in control logic element 16, the control logic element 16 computes a time at which a sample should be taken by ADC 12.

Significantly, the sampling function is a function of previously taken samples (as opposed to being a function of the entire signal). Furthermore, the sampling function causes the system 30 to take samples only when they are innovative for the particular application (e.g. for the signal being sampled). This results in fewer samples being taken. Since the power consumed by system 30 is largely dependent upon sampling frequency, the technique results in system 30 being more efficient in terms of power and processing time, than prior art techniques.

Also, since the time intervals between samples are computed using a function of previously taken samples, it is not necessary to keep sampling times. This results in further power efficiencies since less it is not necessary to transmit sampling times via transmission device 34.

FIGS. 3-6 are a series of flow diagrams showing exemplary processes to perform time-stampless adaptive nonuniform sampling (TANS). Such a process may be performed, for example, by a processing apparatus which may, for example, be provided as part of a sampling system such as that shown in FIG. 2. The rectangular elements (e.g. block 40 in FIG. 3) in the flow diagram(s) are herein denoted "processing blocks" and represent steps or instructions or groups of instructions. Some of the processing blocks can represent an empirical procedure or a database while others can represent computer software instructions or groups of instructions. The diamond shaped elements in the flow diagrams (e.g. block 50 in FIG. 3) are herein denoted "decision blocks" and represent steps of instructions or groups of instructions which affect the processing of the processing blocks. It should be noted that some of the processes described in the flow diagram may be implemented via computer software while others may be implemented in a different manner e.g. via an empirical procedure.

Alternatively, some of the processing blocks can represent steps performed by functionally equivalent circuits such as a digital signal processor circuit or an application specific integrated circuit (ASIC). The flow diagram does not depict the syntax of any particular programming language. Rather, the flow diagram illustrates the functional information one of ordinary skill in the art requires to perform the steps or to fabricate circuits or to generate computer software to perform the processing required of the particular apparatus. It should be noted that where computer software can be used, many routine program elements, such as initialization of loops and variables and the use of temporary variables are not shown. It will be appreciated by those of ordinary skill in the art that unless otherwise indicated herein, the particular sequence of steps described is illustrative only and can be varied without departing from the spirit of the concepts, systems and techniques described herein.

Figure 3:
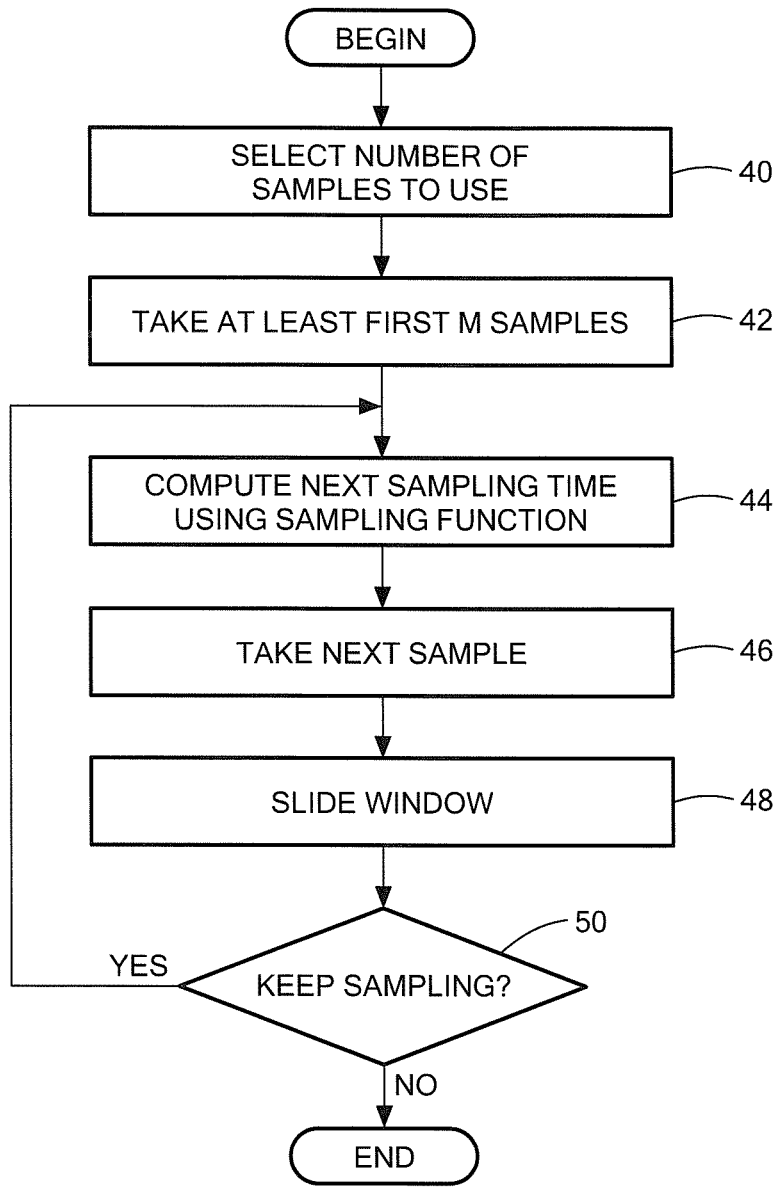
FIG. 3 is a flow diagram of a fixed window process for time-stampless adaptive nonuniform sampling (TANS)

Referring now to FIG. 3, an exemplary time-stampless adaptive nonuniform sampling (TANS) process for a fixed window system begins in processing block 40 by selecting a number of samples to use in each window (hence the windows are said to be "fixed"). Processing then proceeds to processing block 42 in which at least a first M samples within the first window (e.g. window 14 in FIG. 1) are taken.

Figure 4:
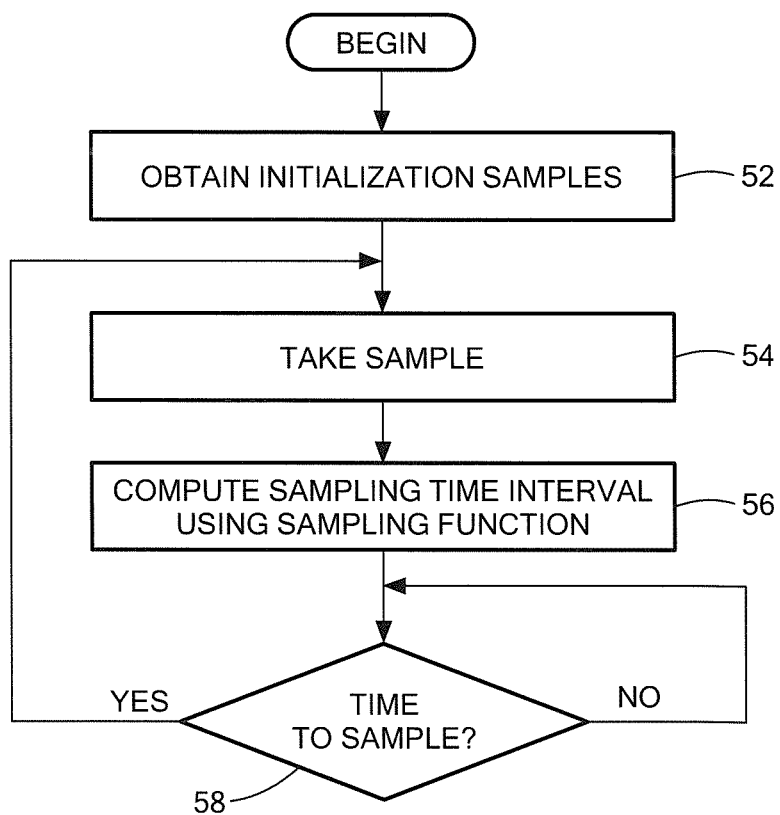
FIG. 4 is a flow diagram of a process for time-stampless adaptive nonuniform sampling.

Next, as shown in processing block 44, a sampling function is used to compute the next sampling time. This means that a sample should be taken after a specific amount of time (i.e. there is no need to keep checking; it should be noted that FIG. 4 shows a variation of the process in which the process keeps checking to see when it is time to sample). In one embodiment, processing block 44 may be accomplished as described below in conjunction with processing blocks 82, 84 of FIG. 6.

It should be appreciated that the sampling function is known on both the sampling and the reconstruction sides of a system employing the TANS technique. It should also be appreciated that the next sampling time depends upon samples taken before that time. As shown in processing block 46, at the appropriate time, the next sample is taken and the window (e.g. window 14 in FIG. 1) slides.

Decision box 50 implements a loop in which if a decision is made to keep sampling, then processing returns to processing block 44 where the next sampling time is computed using the sampling function. If in decision block 44 a decision is made not to keep sampling, then processing ends.

Referring now to FIG. 4, another exemplary embodiment of a time-stampless adaptive nonuniform sampling process begins in processing block 52 by obtaining a plurality of initialization samples. Processing then proceeds to processing block 54 in which a sample is taken. Next, as shown in processing block 56, a sampling interval is computed using a sampling function. Processing then proceeds to decision block 58 in which a loop Is implemented in which it is determined whether it is time to sample (i.e. the process keeps checking to see when it is time to sample). Once it is time to sample, processing proceeds to processing block 54 where a sample is taken and then processing flows to blocks 56, 58.

Figure 5:
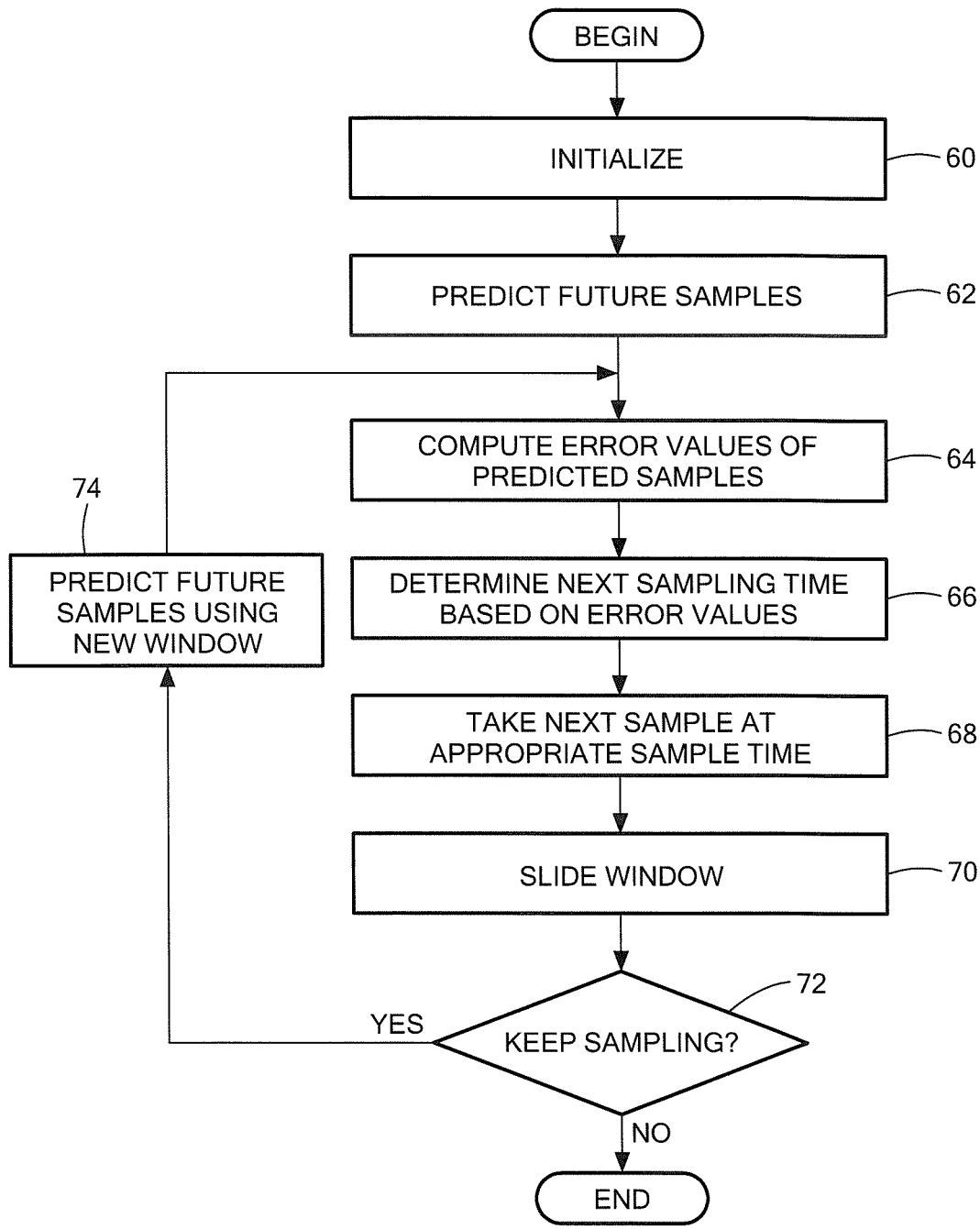
FIG. 5 is a flow diagram of a process for time-stampless adaptive nonuniform sampling.

Referring now to FIG. 5, another exemplary embodiment of a process for time-stampless adaptive nonuniform sampling begins by obtaining initialization samples and then predicting future samples as shown in processing blocks 60, 62.

Next, as shown in processing block 64, error values of the predicted samples are computed and then as shown in processing block 66, the next sampling time is determined based upon the error values.

Processing then proceeds to processing block 68 in which a next sample is taken at an appropriate time. If the sample taken is a last sample in a given window, then the window "slides" as shown in processing block 70.

Processing then proceeds to decision block 72 where a decision is made as to whether additional samples should be taken. If in decision blocking 72, a decision is made to keep sampling then processing flows to processing block 74 in which future samples are predicted using the new window. The processing in blocks 64-72 is then repeated.

If in decision block 72 a decision is made to not keep sampling then processing ends.

Figure 6:
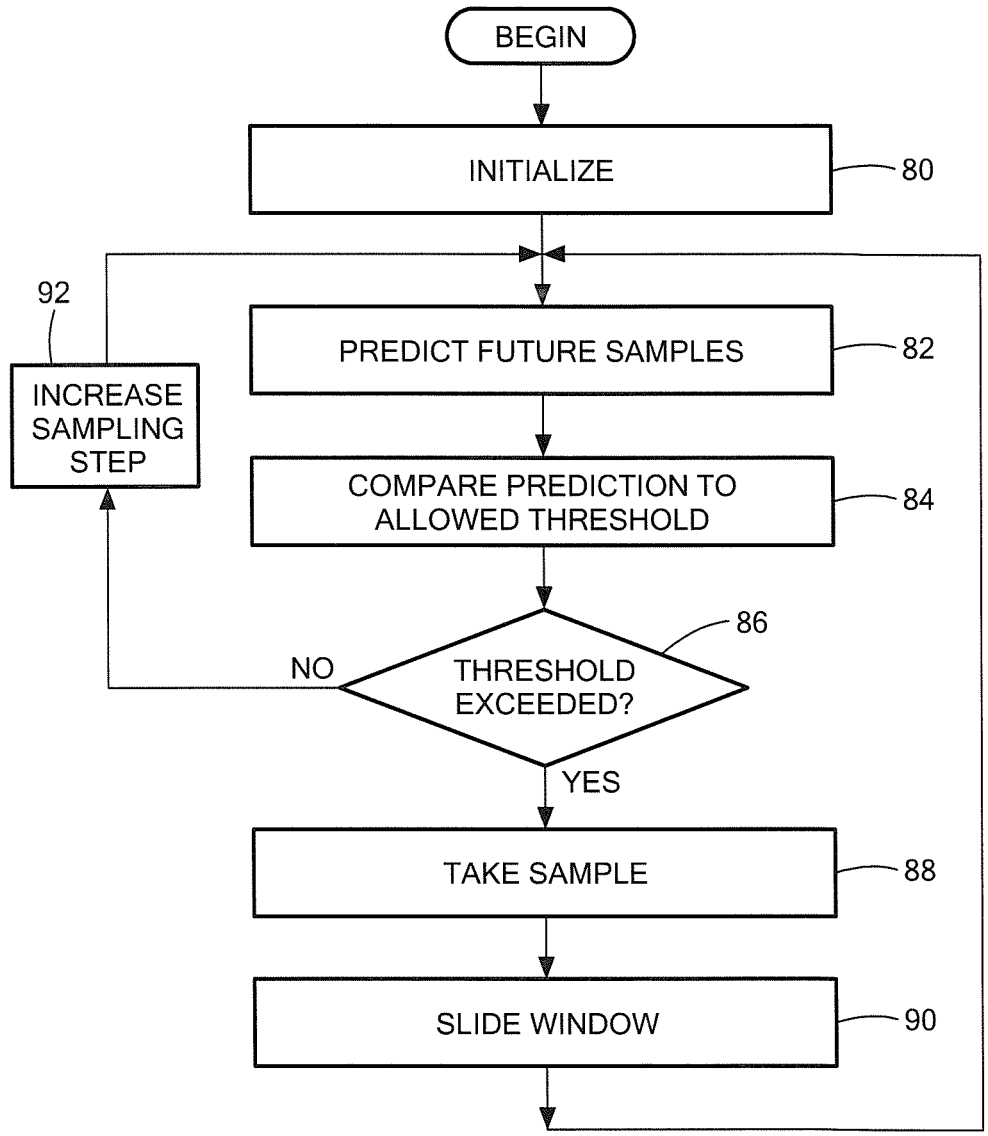
FIG. 6 is a flow diagram of a process for designing a sampling function.

Referring now to FIG. 6, a flow diagram for another exemplary embodiment of a time-stampless adaptive uniform sampling process begins by initializing the system (e.g. by obtaining initialization samples) and predicting future samples as shown in processing blocks 80, 82. The prediction made in block 82 is then compared to a threshold value. The threshold value may correspond, for example, to an allowed distortion value. The threshold value may, of course, be based upon characteristics other than distortion. For example, one may attempt to maintain a certain probability of keeping the approximation error within a specified bound. Those skilled in the art can choose a characteristic appropriate for particular applications. In decision block 86, a decision is made as to whether a distortion threshold is exceeded. If the distortion threshold is exceeded, then a sample is taken and the window slides as shown in processing blocks 88, 90. Processing then returns to processing block 80 and processing blocks 82-90 are repeated.

If in decision bock 86, a decision is made that the predicted values did not exceed the threshold value, then processing flows to processing block 92 where the sampling step is increased and processing returns to processing block 82 and processing blocks 82-86 (and optionally 88, 90) are repeated.

As described hereinabove, a general sampling framework which improves a trade-off between sampling rate and distortion by adapting to local characteristics of a signal being sampled has been described. Significantly, the sampling times are a function (e.g. a causal function) of previous samples, and thus there is no need to stored and/or communicate sampling times. Furthermore, the techniques described herein above can be used with deterministic and stochastic modeling and analysis.

To illustrate the concepts described herein above, next described are three specific methods which can be used in accordance with the general concepts described herein for deterministic and stochastic signals. A Taylor series expansion technique and a Discrete-Time Valued technique are used for deterministic signals and a Generalized Linear Prediction (GLP) technique is used for stochastic signals.

In the examples to be described hereinbelow, the sampling scheme is causal because the next sampling time depends upon samples taken before that time. In general, however, the sampling scheme can be designed to be non-causal. It should also be noted that the reconstruction method can be causal or non-causal. The sampling scheme described herein is an adaptive process, because the sampling function depends upon local characteristics of the signal. Finding an appropriate sampling function of the sampling scheme depends upon sampling requirements such as the sampling rate, the distortion requirement, etc. Table 1 illustrates a taxonomy of proposed sampling functions.

TABLE I

| Sampling Function | Blind | With Side Information |
|---|---|---|
| Deterministic | Taylor Series Expansion (TSE) | Discrete Time Valued |
| Stochastic | Generalized Linear Prediction (GLP) | Linear Prediction with Side Information |

The aim of the sampling scheme described is to balance between the average sampling rate and the reconstruction distortion.

It should be appreciated that this objective is different from the objectives considered in change point analysis or active learning. In those techniques, the objective is to find points of the signal at which the statistical behaviors of the signal change, by causal or non-causal sampling, respectively.

Figure 7:
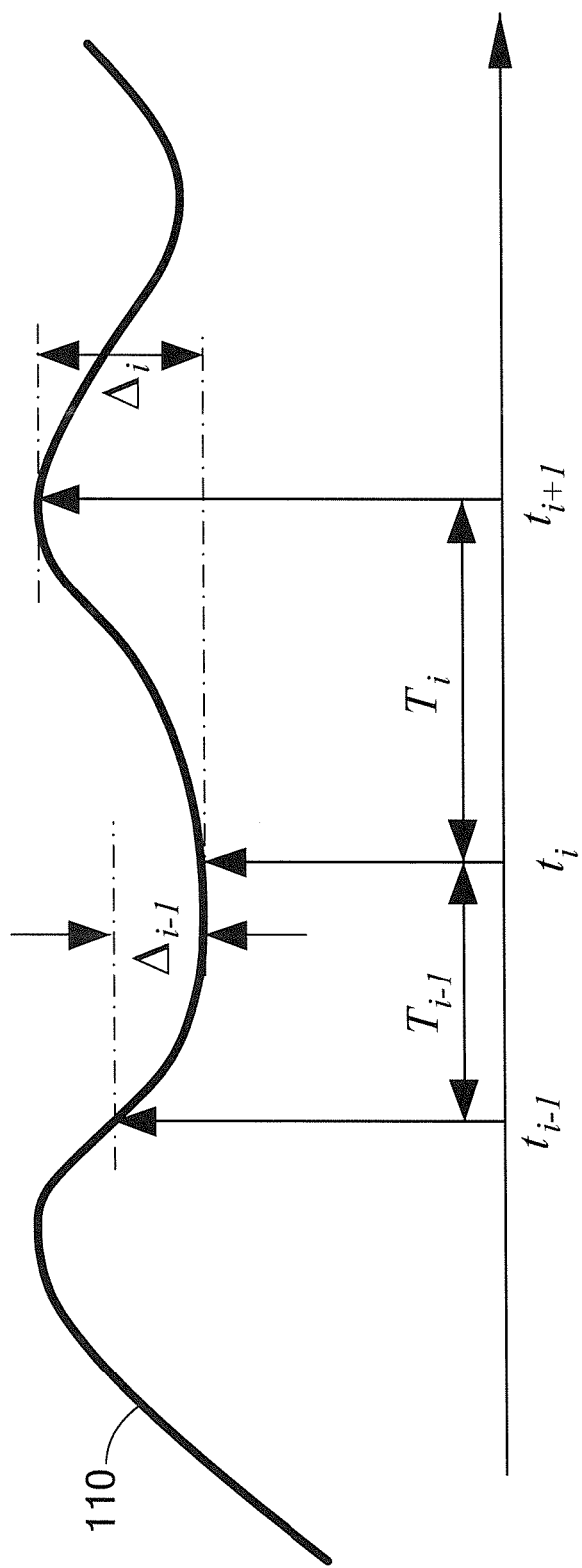
FIG. 7 is a plot of signal amplitude vs. time.

Referring now to FIG. 7, a continuous signal 110 which may be expressed as X(t) has an $i^{th}$ sample taken at time $t_i$. For deterministic signals, assuming the reconstruction method is line connection, the sampling function can be obtained via a Taylor Series Expansion (TSE). Thus, this method is referred to as the Taylor Series Expansion (TSE) method.

In this example, it is explained how a how a sampling function can be computed for a specific set up. This method (as well as the so-called GLP method to be described below) is referred to as a blind sampling method. Thus, Taylor's theorem is used to derive a suitable sampling function for deterministic signals. It should be appreciated that various instantiations of TANS can be derived by using Taylor's theorem, depending on signals of interest, the allowed complexity of the sampling function f, and the distortion requirement.

In the example below, an explanation is provided as to how a sampling function can be computed for a specific setup where X(t) is a continuous signal.

In this example, the following assumptions are made:
($C_1$) the order of the sampling function is two. In other words, the sampling function is a function of three previously taken samples which may be expressed as:

$$T_i = f(U_{j=i-m+1}^{i-1}\{T_j, \Delta_j\}).$$

($C_2$) The reconstruction method is connecting two adjacent samples by a line (this is referred to as non-causal linear interpolation).

Also, the distortion requirement is assumed to be as follows:
($C_3$) If $\hat{X}(t)$ is the reconstructed signal, then $|X(t)-\hat{X}(t)|<D_1$, for all t, where D1 is a sampling parameter.
($C_4$) it is assumed that the third derivative of X(t) is bounded by M;

The upper bound on the absolute value of the third derivative is used as a parameter in the sampling function and is also used in the analysis.

In the Taylor Series Expansion method of the locally adaptive sampling technique described herein, if $|X'''(t)|$ is uniformly bounded by a constant M, under assumptions (c1), (c2), the following sampling function satisfies the sampling requirement (c3).

$$T_i = \arg\max T$$

$$\text{s.t. } (C_1 T + C_2) T^2 \leq D_1 \qquad \text{Equation (1)}$$

where $C_1$ and $C_2$ are constants, defined as follows, $$C_1 = \frac{M}{3}$$

$$C_2 = \frac{\left|\frac{\Delta i - 1}{Ti - 1} - \frac{\Delta i - 2}{Ti - 2}\right|}{\frac{Ti - 1 + Ti - 2}{2}} + \frac{M}{3}\frac{(T_{i-1} + T_{i-2})^2 + (T_{i-1})^2}{T_{i-2}}$$

It is insightful to investigate the behavior of $T_i$, with respect to different involved parameters in Equation (1).

First, it should be noted that increasing $D_1$ leads to an increase in $T_i$. Intuitively, the higher the allowed distortion, the lower the sampling rate, and the larger the sampling time intervals.

Also it should be noted that the first term of C2 (i.e. $|\Delta_{i-1}/T_{i-1} - \Delta_{i-2}/T_{i-2}|/((T_{i-1}+T_{i-2})/2)$ can be viewed as an approximation of the second derivative of the signal X(t) (which may be expressed as $|X''(t)|$) at time $t_i$. It should be appreciated that use of a second derivative is but one of many ways to measure a signal. Since the reconstruction method is a first order linear filter, the higher the second derivative, the faster changes of the signal. Therefore, by increasing $$\frac{\left|\frac{\Delta i - 1}{Ti - 1} - \frac{\Delta i - 2}{Ti - 2}\right|}{\frac{Ti - 1 + Ti - 2}{2}}, T_i$$

the value of $T_i$, should decrease.

While the above has considered deterministic signals, since the proposed sampling method is blind, it renders this method a well-suited choice for uncertain signals. For example, the method may be used when a signal is deterministic over stochastically varying time intervals.

Next described is a family of sampling functions where sampling time intervals are discrete values. Thus, this technique is referred to as a discrete time-valued method.

In this method, the sampling rate is being adapted based upon an estimation of local variations of the signal. This method can be applied to both continuous and discrete signals. In this example, a continuous time version of a signal is considered; however, its discrete time version can be also be derived.

If $|X'''(t)|$ (i.e. third derivative of X(t)) is uniformly bounded by a constant M, under assumptions $C_1$ and $C_2$ mentioned above, an estimate of local variation of the signal at time $t_i$, by using previously taken samples, can be written as follows:

$$w(t_i) \triangleq \frac{\left|\frac{\Delta i - 1}{Ti - 1} - \frac{\Delta i - 2}{Ti - 2}\right|}{\frac{Ti - 1 + Ti - 2}{2}}$$

The error of this estimation can be bounded as follows:

$$\left| w(t_i) - |X''(t_i)| \right| \leq \frac{M}{3}\frac{(T_{i-1} + T_{i-2})^2 + (T_{i-1})^2}{T_{i-2}}$$

Consider the following heuristic sampling function, $$T_i = \begin{cases} f_1(Ti-1) & w(ti) \leq th1 \text{ and } Ti > Tmin \\ Ti-1 & th1 \leq w(ti) < th2 \\ f_2(Ti-1) & w(ti) \geq th2 \text{ and } Ti > Tmax \end{cases}$$

where $$f_1(T_{i-1}) > T_{i-1} \text{ and}$$

$$f_2(T_{i-1}) < T_{i-1}.$$

$T^{min}$ and $T^{max}$ make sampling time intervals to be bounded.

Thresholds $th_1$ and $th_2$ depend upon signal characteristics and sampling requirements. If $W_{(ti)}$ is smaller than a threshold, the signal's slope variations are small and, since $f_1(T_{i-1}) > T_{i-1}$, the sampling rate can be decreased in this case. An analogous argument can be expressed when $w(t_i)$ is greater than a threshold.

An example of the above sampling function with linear increase or decrease of $T_i$ can be expressed as follows, $$T_i = \begin{cases} T_{i-1} + \varepsilon_1 & w(t_i) \leq th_1 \text{ and } T_i > T^{min} \\ T_{i-1} & th_1 \leq w(t_i) < th_2 \\ T_{i-1} - \varepsilon_2 & w(t_i) \geq th_2 \text{ and } T_i < T^{max} \end{cases}$$

where $\in_1$ and $\in_2$ are positive constants. Note that, given $T_{i-1}$, there are only three possibilities for $T_i$, so, the sampling time intervals are discrete.

Next described is a family of sampling functions based upon a generalized linear prediction filter. Thus, this technique is referred to as a generalized linear prediction (GLP) method. This sampling method is for discrete stochastic signals.

In this method, the signal is locally stationary. This family of signals is described in detail below. The reconstruction method and the distortion measure used are as follows:

(C7) the reconstruction method is using a generalized linear prediction filter; and (C8) if $\hat{X}[n]$ is the reconstructed signal, we want to have $E[(X[n]-\hat{X}[n])^2] \leq D_2$, where $D_2$ is a sampling parameter.

A generalized linear prediction filter for stationary signals is next described. Assume X[n] is a stationary signal and further assume there are M samples of X[n] at times $n-m_1$, $n-m_2$, ..., and $n-m_M$. The aim is to predict linearly X[n] by using these known samples so that the expected mean square error is minimized (MMSE predictor).

$$\min_{w_{m1},\ldots,w_{mM}} E\left[|\tilde{X}[n]|^2\right]$$

subject to $$\hat{X}[n] = \sum_{k=1}^{m} w_{mk} X[n - m_k]$$

$$\tilde{X}[n] = X[n] - \hat{X}[n].$$

A solution of this linear optimization can be called $w_{mi}^*$ for $1 \leq i \leq M$. One difference of this setup with a traditional linear prediction is to predict X[n] by a set of non-uniform samples. In an optimal scheme, the error term should be orthogonal to all known samples as expressed by Equation (2):

$$E[X[n-m_k]\tilde{X}^*[n]]=0 \quad \text{Equation (2)}$$

for k=1, . . . , M, where $\tilde{X}^*[n]=X[n]-\Sigma_{k=1}^{M}w_{mk}^*X[n-m_k]$. An auto-correlation function of X[n] can be written as shown in Equation (3):

$$r[i]=E[X[n]X^c[n-i]] \quad \text{Equation (3)}$$

where $X^C[n]$ is the conjugate of X[n]. Since this example deals with real signals, without loss of generality conjugation effects are ignored. Hence, by using Equations (2) and (3), the following set of linear equations are found:

$$r[-mk]=\Sigma_{i=1}^{M}w_{mi}^*r[m_i-m_k] \quad \text{Equation (4)}$$

for k=1, . . . , M. This can be expressed in matrix form as shown in Equation (5):

$$m=[m_1, \ldots, m_M]^T$$

$$X_m^n=[X[n-m_1], \ldots, X[n-m_M]]^T$$

$$P=[r[-m_1], \ldots, r[-m_M]]^T$$

$$W_m^*=[w_{m1}^*, \ldots, w_{mM}^*]^T$$

$$R=E[(X_m^n)(X_m^n)^T].$$

Thus, linear equations of Equation (4) can be written as a matrix multiplication $$p=Rw_{mi}^*$$

For X[n] with zero mean, define, $$\sigma_X^2=E[|X[_n]|^2]=r[0]$$

$$\sigma_{\tilde{X}}^2=E[|\tilde{X}^*[_n]|^2]$$

Thus, for generalized liner prediction:

$$p=Rw_{mi}^*$$

$$\sigma_{\tilde{X}}^2=r[0]-p^Tw_m^*$$

For LAS with a generalized linear prediction filter, and assuming that a signal [n] is a locally stationary signal, locally stationary processes can be used as a tool to model systems where their statistical behavior varies with time. Definitions of a locally stationary process are provided in S. Mallat, G. Papanicolaou, and Z. Zhang, "Adaptive covariance estimation of locally stationary processes," *Annals of Statistics*, vol. 26, no. 1, pp. 1-47, 1998 and D. Donoho, S. Mallat, and R. von Sachs, "Estimating covariances of locally stationary processes: rates of convergence of best basis methods," *Statistics, Stanford University, Stanford, Calif., USA, Tech. Rep*, 1998.

Intuitively, a locally stationary process is a process where one can approximate its local covariance coefficients within an error. The above-mentioned Mallat Reference approximates the covariance of a locally stationary process by a covariance which is diagonal in basis of cosine packets, while the above-mentioned Donoho reference proposes a method to estimate the covariance from sampled data.

For simplicity, a fixed window size is assumed. It should be appreciated, of course, that this can also vary by time.

A window $W_L[n]$ with length L can be defined as follows, $$W_L[n] = \begin{cases} 1 & 0 \le n \le L-1 \\ 0 & \text{otherwise} \end{cases}$$

$X_L^{ni}[n]$ is a truncated version of X[n] which has its samples over $n_i-L+1 \le n \le n_i$.

That is:

$$X_L^{ni}[n]=X[n]\cdot W_L[n-ni+L-1].$$

For $X_L^{ni}[n]$, auto-correlation coefficients can be written as follows, $$r^{ni}_L[k]=E[X_L^{ni}[n]X_L^{ni}[n-k]].$$

By using these coefficients, for m=[0, 1, . . . , M–1]$^T$, where M<L, matrices can be defined as $(X_L^{ni})_L$, $P_L^{ni}$, $(w_m^*)_L^{ni}$ and $R_L^{ni}$ similarly to Equation (5) above. Since X[n] is assumed to be locally stationary, for any time $n_0$ and any given $\in$, there exists an appropriate L such that, $$|E[|\tilde{X}[n_i+1]|^2]-r^{ni}_L[0]+(P^{ni}_L)T(w_m^*)^{ni}_L|<\in,$$

Where $$\tilde{X}[n_i+1]=X[n_i+1]-((w_m^*)_L^{ni})^T(X_m^{ni})_L$$

L is referred to as a window size of the locally stationary signal and $L_0$ and $L_1$ are defined as the minimum and the maximum allowed window sizes, respectively. The stochastic nature of the signal affects $L_0$ and $L_1$.

Intuitively, since X[n] is locally stationary, its MMSE linear prediction filter with locally estimated autocorrelation coefficients leads to an approximately same error as the one of stationary signals. Now, a setup of LAS by using a MMSE generalized linear prediction filter for locally stationary signals can be introduced. Except being locally stationary, there are no other assumptions on the signal. Hence, this method is referred to as a blind sampling method.

Suppose X[n] is a locally stationary signal with window size L and there are M samples $X[n_i], X[n_{i-m2}] \ldots X[n_{i-mM}]'$ where $0<m_2<m_3<\ldots<m_M<L$. Now, consider a truncated signal $X_L^{ni}[n]$ as defined above. If only taken samples of this truncated signal are used (i.e. X[n–mi] for $1\le i\le M$), the approximations for $R_L^{ni}$, $P_L^{ni}$ and $(w_m^*)_L^{ni}$ can be computed and are referred to as $\hat{R}_L^{ni}$, $\hat{P}_L^{ni}$ and $(\hat{w}_m^*)_L^{ni}$ respectively.

If L is sufficiently larger than $L_0$, we will have enough known samples in the truncated signal and these approximations can be close to $R_L^{ni}$, $P_L^{ni}$ and $(w_m^*)_L^{ni}$. Then, one can linearly predict $X[n_i+N_i]$ by using samples $X[n_i]$, $X[n_{i-m2}]' \ldots$, and $X[n_{i-mM}]$. It is assumed that parameter $L_1$ of the locally stationary signal is sufficiently large.

Hence, by using $\sigma_{\tilde{X}}^2=r[0]-p^Tw_m^*$ and $|E[|\tilde{X}[n_i+1]|^2]-r^{ni}_L[0]+(P^{ni}_L)T(w_m^*)^{ni}_L|<\in$, $$|E[|\tilde{X}[ni+1]|^2]-\tilde{r}_L^{ni}[0]+(\hat{P}_L^{ni})T(\hat{w}_m^*)_L^{ni}|<\in$$

where $\in$ is a small positive constant and m=[$N_i$, $N_{i+m2}$, . . . , $N_{i+mM}$]. The reconstructed signal can be written as, $$\hat{X}[n_i+n_i]=((\hat{w}_m^*)_L^{ni})^T X_m^{ni+Ni}.$$

A sampling function for this scheme chooses the greatest possible $N_i$ to have the expected error less than a threshold value D2. Thus, this sampling function can be written as the following linear optimization setup:

Max $N_i$ s.t. $\hat{X}[n_i+N_i]=((\hat{w}_m^*)_L^{ni})^T X_m^{ni+Ni}.$ $$\hat{P}_L^{ni}=\hat{R}_L^{ni}(\hat{w}_m^*)_L^{ni}$$

$$\tilde{r}_L^{ni}[0]-(\hat{P}_L^{ni})^T(\hat{w}_m^*)_L^{ni}|<D_2$$

It should be noted that, if the window size L is sufficiently larger than the minimum allowed window size $L_0$, there are enough known samples in the window, and these approximations would be appropriate. However, if there are not enough known samples in the window, autocorrelation coefficients of the previous window can be used.

Next described is a sampling function based upon linear prediction with side information about the signal. Hence, this method is non-blind. Consider a signal model described as:

$$X[n]=\alpha_{\theta_n}X[n-1]+Z_{\theta_n}[n]$$

where $\theta_n$ is the state of a hidden Markov chain (MC) with state transition probability p.

Suppose its parameters (i.e., $\alpha_{\theta_n}$) are known for every n. Also, assume that the transition probability of the underlying MC, p, is small. These parameters form the side information. For reconstruction, a linear prediction filter is used.

Consider A={(R, MSE)} as a set of achievable rate distortion pairs for this signal model and consider the MSE of the error as a distortion measure. Similarly, $A_s$ can be defined as $A_s=\{(R_s, MSE_s)\}$, a set of achievable rate-distortion pairs within state s. The next sample is taken when the prediction error (or, the noise variance) exceeds a threshold value D3.

For the signal model described above (i.e. $X[n]=\alpha_{\theta_n}X[n-1]+Z_{\theta_n}[n]$), the following rate-distortion pairs are achievable, $$A = \{R, MSE) \mid (R, MSE)$$
$$= \frac{1}{2}(1/K_0, MSE_0) + \frac{1}{2}(1/K_1, MSE_1)\}$$

where, $$MSE_s = \sum_{i=1}^{K_s-1} (1-\alpha_s^{2i})/K_s$$

and $$K_s = \begin{cases} \log(1-D_3)/2\log\alpha_s & \alpha_s \notin \{0, 1\} \\ 1 & \alpha_s = 0 \\ 0 & \alpha_s = 1 \end{cases}$$

where $0 \le D3 \le 1$ is a sampling parameter and $s \in \{0, 1\}$ represents the state of the Markov Chain. By using $X[n]=\alpha_{\theta_n}X[n-1]+Z_{\theta_n}[n]$) for each state s, results in:

$$X[n+K] = \alpha K_s X[n] + \sum_{i=1}^{K} z[n+i]a_j^{k-i}$$
$$= \alpha K_s X[n] + Z_{s,K}.$$

Hence, $$\sigma_{Z_x,K}^2 = 1 - \alpha_s^{2K}$$

Consider a sample when the prediction error (or, the noise variance) exceeds a threshold value D3. Hence, for $\alpha_s \notin \{0, 1\}$ a maximum value of K is chosen to have:

$$1-\alpha_s^{2K} \le D_3$$

Hence, at state s, $$K_s = \log(1-D_3)/2 \log(\alpha_s)$$

when $\alpha_s \notin \{0, 1\}$.

It should be noted that cases when $\alpha_s=0$ or $\alpha_s=1$ are trivial. Suppose $MSE_s(l)=E[(X[n+l]-\hat{X}[n+l])^2]$ at state s.

If samples are taken at times n and $n+K_s$, then $MSE_s(0)=MSE_s(K_s)=0$.

For $l \notin \{0, K_s\}$, $MSE_s(l) = \sigma_{Z_s,l}^2 = 1-\alpha_s^{2l}$

Hence, the average MSE at each state s (called $MSE_s$) is:

$$MSE_s = \sum_{i=1}^{K_s-1} (1-\alpha_s^{2K})/K_s$$

The foregoing description has in some instances been directed to specific embodiments. It will be apparent, however, that variations and modifications may be made to the described embodiments, with the attainment of some or all of their advantages.

For instance, a family of locally adaptive sampling schemes (sometime referred to as LAS) which can be applied on both stochastic signals has been described. In this sampling family, time intervals between samples can be computed by using a function of previously taken samples (referred to herein as a sampling function). Hence, although it is a non-uniform sampling, it is not necessary to keep sampling times. The aim of this sampling scheme is to have the average sampling rate and the reconstruction error satisfy some requirements. Four different schemes of LAS have been described to help explain different properties: Taylor Series Expansion (TSE) and Discrete Time Valued (DTV) methods for deterministic signals; Generalized Linear Prediction (GLP) and Linear Prediction with Side Information (LPSI) methods for stochastic signals. TSE and GLP were referred to as blind methods since they included a general condition on the considered signal (bounded third derivative for TSE, and being locally stationary for GLP). However, DTV and LPSI methods are non-blind, because the sampling scheme is specifically designed for a known signal model.

Accordingly, in view of the description provided hereinabove, it should now be apparent to those of ordinary skill in the art that the systems and processes described herein find use in a wide variety of applications.

Sensing, for example, is a process performed in any system interacting with the real world and one of the main power consumption contributors of low power devices. For this reason, the framework described herein can be applied to a wide variety of different sensing and other systems, enabling the development of new applications in the future.

For example, several research projects refer to continuous health monitoring by using either custom sensors or platforms based on commercial mobile phones, recording ECG signals and other human's vital information. The current approach for the design of these systems is to continuously sample the considered signals at a rate greater than or equal to the maximum rate of happening an event of interest. However, in the approach described herein, the sampling rate is adapted by using previously taken samples as described herein above. Furthermore, it is not necessary to keep sampling times. Hence, the scheme described herein achieves a lower power consumption in the sensing process.

For example, a generic sampling function can be designed by bounding the derivative of the signal by the integral of its Fourier transform and then using the Cauchy-Schwarz inequality as follows:

$$T_i = [(p/c)(1/(w(t_i)^2))]^{1/3}$$

In which:
p is the signal power;
c is a sampling parameter;
$w(t_i)$ is an approximation of a derivative of a signal at time $t_i$ where
i.e., $w(t_i)=abs[(\Delta_{i-1})/(T_{i-1})]$.

It should be noted that the higher the derivative at time $t_i$, the higher the signal variations at this time, and the smaller the sampling step size. It should also be noted that, this sampling function is not designed specifically for ECG signals. In some simulations on ECG signals, a sampling function designed by using characteristics of ECG signals to provide more gain was used. Simulation results with real ECG signals indicate advantages of the approach described herein, reducing by approximately an order of magnitude the sampling rate compared to uniform sampling.

Figure 8:
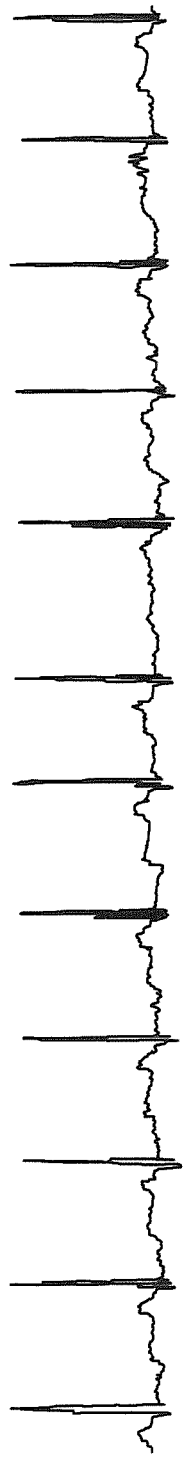
FIG. 8 is a plot of an EKG signal.
Figure 8A:
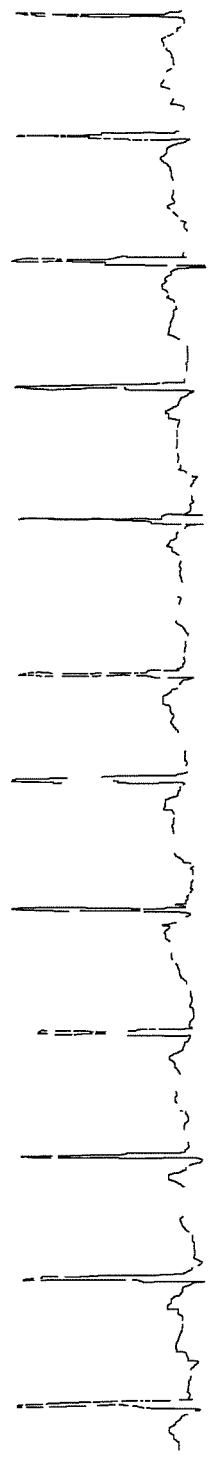
FIG. 8A is a plot of a reconstructed EKG signal using TANS.
Figure 8B:
FIG. 8B is a plot of a reconstructed EKG signal using uniform sampling.

FIG. 8, for example, illustrates an ECG signal while FIGS. 8A and 8B illustrate two reconstructed ECG signals using the same number of samples (i.e., a down sampling factor of 10). FIG. 8A illustrates a reconstructed ECG signal using the techniques described herein while FIG. 8B illustrates a reconstructed ECG signal by uniform sampling. One can see that, the approach used in FIG. 8A provides a better reconstructed signal given the same sampling rate.

The framework described herein can also be applied to a majority of applications that involve the interaction of smartphones and humans as well as a surrounding environment. For instance, the use of smartphones, equipped with several sensors has been proposed for traffic monitoring, sound sensing, location tracking and many other scenarios. Although most of these proposed ideas seem promising applications in the future, the strict power constraints of portable devices are a main obstacle in their realizations. It is believed that the framework described herein can be an efficient solution in applications requiring continuous sampling and interaction with the real world. This is particularly true in view of data showing that sensors in a modern smartphone can consume approximately up to 60% of the overall power consumption when the phone is in sleep mode.

While exemplary applications of TANS have been describe herein, those of ordinary skill in the art will appreciate that TANS can also be used in a wide variety of other applications.

Accordingly, it is submitted that that the concepts and techniques described herein should not be limited to the described embodiments but rather should be limited only by the spirit and scope of the appended claims.

What is claimed is:

1. A sampling method comprising:
   (a) obtaining M samples of a signal using an analog-to-digital converter (ADC);
   (b) computing a next sample time as a function of previously obtained samples of the signal wherein the sampling function is adaptive and time-stampless; and
   (c) recovering sampling times using sample values and sample times from the M samples obtained from the signal.

2. The method of claim 1 wherein computing a next sample time as a function of previously obtained samples comprises computing a next sample time as a function of only M previously obtained samples.

3. A method of sampling a signal, the method comprising:
   (a) obtaining M samples of the signal using an analog-to-digital converter (ADC);
   (b) computing a next sample time as a function of only the M previously obtained samples of the signal wherein the sampling is adaptive, nonuniform, and self-synchronizing; and
   (c) recovering sampling times using the sample values and the sample times taken of the first M samples of the signal.

4. A method of adaptive, nonuniform sampling, the method comprising:
   identifying a sampling function;
   obtaining a first set of M samples from a signal using an analog-to-digital converter (ADC), wherein the first set of M samples includes sample times and sample values;
   obtaining additional samples from the signal wherein the samples are obtained at time intervals determined by applying the sampling function to one or more of the first set of M samples;
   providing to a receiver: (a) the sampling function; (b) the sample times of the first M samples; (c) the values of the additional samples; and
   recovering sampling times of the additional samples in the receiver using only the sampling function, the obtained sample values and sample times taken of the first M samples of the signal.

5. The method of claim 4 wherein recovering sampling times in a receiver comprises computing the sampling times via the sampling function.

6. The method of claim 4 wherein the signal being sampled corresponds to a stochastic signal and wherein the stochastic signal is locally stationary and wherein the sampling function is based upon a linear prediction filter which utilizes a General Linear Prediction (GLP) sampling function.

7. The method of claim 4 wherein the signal being sampled corresponds to a stochastic signal having a known signal model and the sampling function is based upon a linear prediction filter which utilizes a linear prediction sampling function with side information (LPSI).

8. A system comprising:
   an analog-to-digital converter (ADC) configured to obtain samples of an input signal, one or more of the obtained samples having a sample value and a sample time; and
   a control means, coupled to said ADC, said control means for controlling the times at which said ADC samples the input signal, said control means computing a next sample time as a function of previously obtained samples.

9. The system of claim 8 further comprising a transmission system coupled to said ADC and configured to transmit sample values obtained by the ADC.

10. The system of claim 9 further comprising a receiving system configured to receive sample values transmitted by said transmission system, said receiving system comprising means for recovering sample times associated with the received sample values using the sampling function.

11. The system of claim 8 wherein said control means is provided as a digital signal processor.

12. The system of claim 11 wherein said digital signal processor implements a real time compression scheme which adaptively compresses a signal using its local properties causally.

13. The method of claim 1 further comprising:
   predicting a future sample based upon at least some of the M samples;
   computing an error value of the predicted future sample; and
   comparing the error value to a threshold value.

14. The method of claim 13 further comprising:
   in response to the error value exceeding the threshold value, obtaining a next sample.

15. The method of claim 14 further comprising:
   in response to the error value not exceeding the threshold value, increasing a sampling time and computing a new predicted future sample.

16. The method of claim 13 wherein predicting a future sample based upon at least some of the initial number of samples comprises predicting a future sample based upon all of the initial number of samples.

17. The method of claim 13 wherein the threshold value corresponds to an allowed distortion value.

18. The method of claim 1 wherein obtaining M samples of the signal comprises obtaining a first set of signal samples, the method further comprising:
- using first set of signal samples to determine a sampling function to compute time intervals between samples; and
- sampling the signal at a time determined by the sampling function.

19. The method of claim 18 wherein the sampling function is based upon a set of the M most recently taken samples.

20. The method of claim 18 wherein the sampling function is selected in accordance with sampling requirements and distortion requirements.

21. The method of claim 18 wherein:
- in response to the signal being a stochastic signal, the sampling function is based upon one of: (1) the greedy method; or (2) a dynamic programming technique; and
- in response to the signal being a deterministic signal, the sampling function is based upon one of: (1) a Taylor expansion series; (2) a discrete-time valued function.

22. The method of claim 3 further comprising:
- predicting a future sample based upon at least some of the M samples;
- computing an error value of the predicted future sample; and
- comparing the error value to a threshold value.

* * * * *